United States Patent
O'Donnell

(10) Patent No.: US 7,093,375 B2
(45) Date of Patent: Aug. 22, 2006

(54) APPARATUS AND METHOD FOR UTILIZING A MENISCUS IN SUBSTRATE PROCESSING

(75) Inventor: Robert J. O'Donnell, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 111 days.

(21) Appl. No.: 10/956,799

(22) Filed: Sep. 30, 2004

(65) Prior Publication Data

US 2005/0217703 A1    Oct. 6, 2005

Related U.S. Application Data

(63) Continuation-in-part of application No. 10/883,301, filed on Jun. 30, 2004, now Pat. No. 6,954,993, which is a continuation-in-part of application No. 10/404,692, filed on Mar. 31, 2003, now Pat. No. 6,988,327, which is a continuation-in-part of application No. 10/330,843, filed on Dec. 24, 2002, which is a continuation-in-part of application No. 10/261,839, filed on Sep. 30, 2002.

(51) Int. Cl.
     F26B 21/06  (2006.01)

(52) U.S. Cl. ............................. 34/79; 34/92

(58) Field of Classification Search ............ 34/79, 34/80, 77, 92; 134/31; 216/84; 118/52
     See application file for complete search history.

(56) References Cited

U.S. PATENT DOCUMENTS

| | | | |
|---|---|---|---|
| 4,086,870 A | 5/1978 | Canavello et al. | |
| 4,838,289 A | 6/1989 | Kottman et al. | |
| 5,271,774 A | 12/1993 | Leenaars et al. | |
| 5,294,257 A | 3/1994 | Kelly et al. | |
| 5,660,642 A | 8/1997 | Britten | |
| 5,705,223 A | 1/1998 | Bunkofske | |
| 5,807,522 A | 9/1998 | Brown et al. | |
| 5,830,334 A | 11/1998 | Kobayashi | |
| 5,882,433 A | 3/1999 | Ueno | |
| 5,945,351 A | 8/1999 | Mathuni | |
| 5,975,098 A | 11/1999 | Yoshitani et al. | |
| 5,989,478 A | 11/1999 | Ouellette et al. | |
| 5,997,653 A | 12/1999 | Yamasaka | |
| 6,132,586 A | 10/2000 | Adams et al. | |
| 6,341,998 B1 | 1/2002 | Zhang | |

(Continued)

FOREIGN PATENT DOCUMENTS

EP    0 905 746 A1    3/1999

(Continued)

OTHER PUBLICATIONS

J.A. Britten, "A moving-zone Marangoni drying process for critical cleaning and wet processing," Oct. 1997, *Solid State Technology*.

*Primary Examiner*—S. Gravini
(74) *Attorney, Agent, or Firm*—Martine Penilla & Gencarella, LLP

(57) ABSTRACT

An apparatus for processing a substrate is provided which includes a proximity head proximate to a surface of the substrate when in operation. The apparatus also includes an opening on a surface of the proximity head to a cavity defined in the proximity head where the cavity delivers an active agent to the surface of the substrate through the opening. The apparatus further includes a plurality of conduits on the surface of the proximity head that generates a fluid meniscus on the surface of the substrate surrounding the opening.

15 Claims, 22 Drawing Sheets

U.S. PATENT DOCUMENTS

| | | |
|---|---|---|
| 6,391,166 B1 | 5/2002 | Wang |
| 6,398,975 B1 | 6/2002 | Mertens et al. |
| 6,491,764 B1 | 12/2002 | Mertens et al. |
| 6,514,570 B1 | 2/2003 | Matsuyama et al. |
| 6,531,206 B1 | 3/2003 | Johnston et al. |
| 6,988,326 B1 * | 1/2006 | O'Donnell et al. ............ 34/381 |
| 2002/0121290 A1 | 9/2002 | Tang et al. |
| 2002/0125212 A1 | 9/2002 | Mertens et al. |
| 2004/0069329 A1 * | 4/2004 | de Larios et al. .......... 134/95.2 |
| 2005/0139318 A1 * | 6/2005 | Woods et al. .......... 156/345.21 |
| 2005/0145265 A1 * | 7/2005 | Ravkin et al. ................. 134/21 |
| 2006/0064895 A1 * | 3/2006 | Garcia et al. ................. 34/566 |

FOREIGN PATENT DOCUMENTS

| | | |
|---|---|---|
| EP | 0 905 747 A1 | 3/1999 |
| JP | 58037190 | 3/1983 |
| JP | 2280330 | 11/1990 |
| JP | 2309638 | 12/1990 |
| JP | 08277486 | 10/1996 |
| JP | 11350169 | 12/1999 |
| JP | 2003-151948 | 5/2003 |
| WO | WO 99/16109 A1 | 4/1999 |
| WO | WO 02/001613 A3 | 1/2002 |
| WO | WO 02/32825 A1 | 4/2002 |
| WO | WO 02/101795 A3 | 12/2002 |
| WO | WO 2004/030051 A2 | 4/2004 |

* cited by examiner

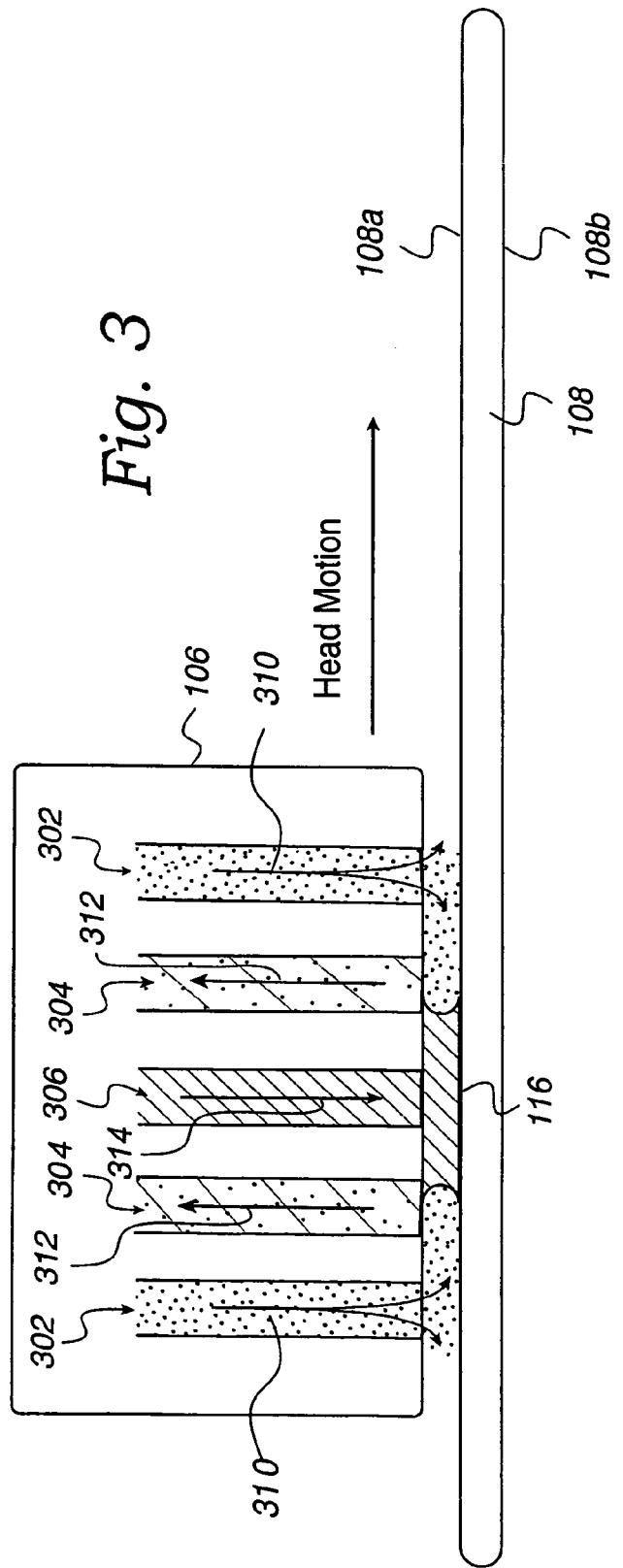

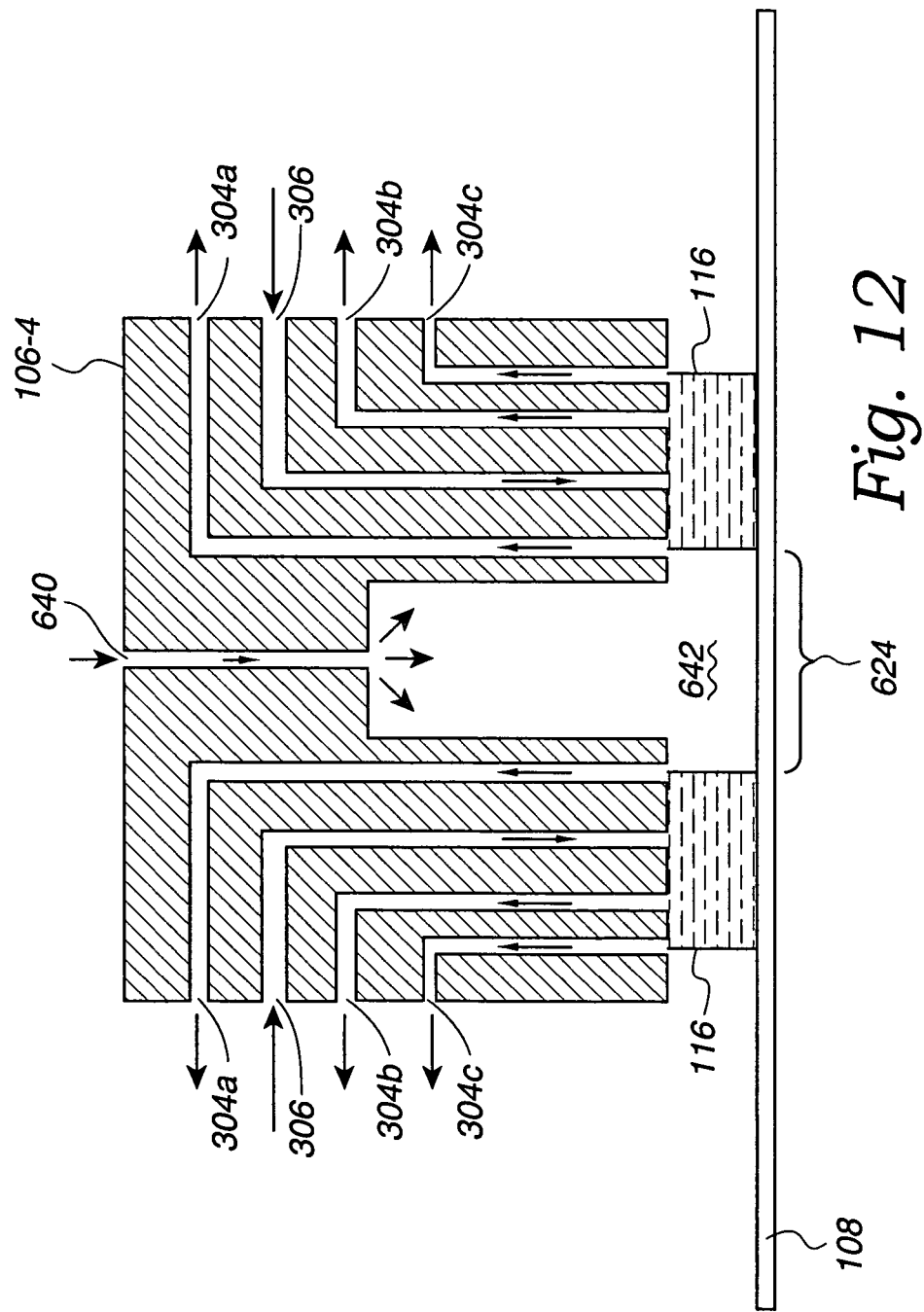

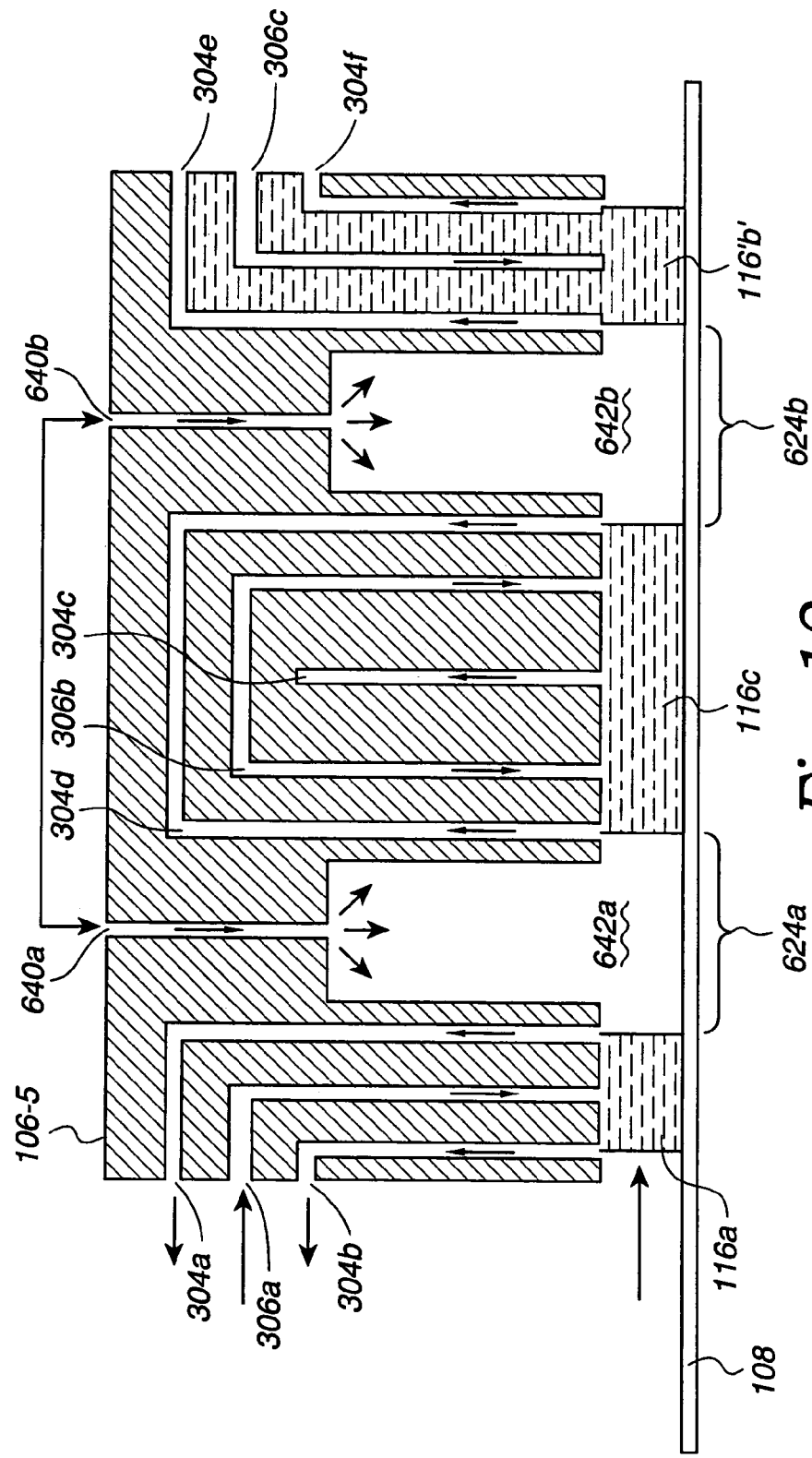

APPARATUS AND METHOD FOR UTILIZING A MENISCUS IN SUBSTRATE PROCESSING

CROSS REFERENCE TO RELATED APPLICATION

This is a continuation-in-part of a U.S. patent application Ser. No. 10/883,301, filed on Jun. 30, 2004, now U.S. Pat. No. 6,954,993 from which priority under 35 U.S.C. § 120 is claimed, entitled "Concentric Proximity Processing Head" which is a continuation-in-part of U.S. patent application Ser. No. 10/404,692, filed on Mar. 31, 2003 now U.S. Pat. No. 6,988,327, from which priority under 35 U.S.C. § 120 is claimed, entitled "Methods and Systems for Processing a Substrate Using a Dynamic Liquid Meniscus" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces." The aforementioned patent applications are hereby incorporated by reference in their entirety.

BACKGROUND OF THE INVENTION

1. Field of the Invention

The present invention relates to semiconductor wafer processing and, more particularly, to apparatuses and techniques for more efficiently applying and removing fluids from wafer surfaces while reducing contamination and decreasing wafer processing costs.

2. Description of the Related Art

In the semiconductor chip fabrication process, it is well-known that there is a need to process a wafer using operations such as cleaning and drying. In each of these types of operations, there is a need to effectively apply and remove fluids for the wafer operation process.

For example, wafer cleaning may have to be conducted where a fabrication operation has been performed that leaves unwanted residues on the surfaces of wafers. Examples of such a fabrication operation include plasma etching (e.g., tungsten etch back (WEB)) and chemical mechanical polishing (CMP). In CMP, a wafer is placed in a holder which pushes a wafer surface against a rolling conveyor belt. This conveyor belt uses a slurry which consists of chemicals and abrasive materials to cause the polishing. Unfortunately, this process tends to leave an accumulation of slurry particles and residues at the wafer surface. If left on the wafer, the unwanted residual material and particles may cause, among other things, defects such as scratches on the wafer surface and inappropriate interactions between metallization features. In some cases, such defects may cause devices on the wafer to become inoperable. In order to avoid the undue costs of discarding wafers having inoperable devices, it is therefore necessary to clean the wafer adequately yet efficiently after fabrication operations that leave unwanted residues.

After a wafer has been wet cleaned, the wafer must be dried effectively to prevent water or cleaning fluid remnants from leaving residues on the wafer. If the cleaning fluid on the wafer surface is allowed to evaporate, as usually happens when droplets form, residues or contaminants previously dissolved in the cleaning fluid will remain on the wafer surface after evaporation (e.g., and form water spots). To prevent evaporation from taking place, the cleaning fluid must be removed as quickly as possible without the formation of droplets on the wafer surface. In an attempt to accomplish this, one of several different drying techniques are employed such as spin drying, IPA, or Marangoni drying. All of these drying techniques utilize some form of a moving liquid/gas interface on a wafer surface which, if properly maintained, results in drying of a wafer surface without the formation of droplets. Unfortunately, if the moving liquid/gas interface breaks down, as often happens with all of the aforementioned drying methods, droplets form and evaporation occurs resulting in contaminants being left on the wafer surface. The most prevalent drying technique used today is spin rinse drying (SRD).

FIG. 1A illustrates movement of fluids on a wafer 10 during an SRD process. In this drying process, a wet wafer is rotated at a high rate by rotation 14. In SRD, by use of centrifugal force, the fluid used to rinse the wafer is pulled from the center of the wafer to the outside of the wafer and finally off of the wafer as shown by fluid directional arrows 16. As the fluid is being pulled off of the wafer, a moving liquid/gas interface 12 is created at the center of the wafer and moves to the outside of the wafer (i.e., the circle produced by the moving liquid/gas interface 12 gets larger) as the drying process progresses. In the example of FIG. 1A, the inside area of the circle formed by the moving liquid/gas interface 12 is free from the fluid and the outside area of the circle formed by the moving liquid/gas interface 12 is the fluid. Therefore, as the drying process continues, the section inside (the dry area) of the moving liquid/gas interface 12 increases while the area (the wet area) outside of the moving liquid/gas interface 12 decreases. As stated previously, if the moving liquid/gas interface 12 breaks down, droplets of the fluid form on the wafer and contamination may occur due to evaporation of the droplets. As such, it is imperative that droplet formation and the subsequent evaporation be limited to keep contaminants off of the wafer surface. Unfortunately, the present drying methods are only partially successful at the prevention of moving liquid interface breakdown.

In addition, the SRD process has difficulties with drying wafer surfaces that are hydrophobic. Hydrophobic wafer surfaces can be difficult to dry because such surfaces repel water and water based (aqueous) cleaning solutions. Therefore, as the drying process continues and the cleaning fluid is pulled away from the wafer surface, the remaining cleaning fluid (if aqueous based) will be repelled by the wafer surface. As a result, the aqueous cleaning fluid will want the least amount of area to be in contact with the hydrophobic wafer surface. Additionally, the aqueous cleaning solution tends cling to itself as a result of surface tension (i.e., as a result of molecular hydrogen bonding). Therefore, because of the hydrophobic interactions and the surface tension, balls (or droplets) of aqueous cleaning fluid forms in an uncontrolled manner on the hydrophobic wafer surface. This formation of droplets results in the harmful evaporation and the contamination discussed previously. The limitations of the SRD are particularly severe at the center of the wafer, where centrifugal force acting on the droplets is the smallest. Consequently, although the SRD process is presently the most common way of wafer drying, this method can have difficulties reducing formation of cleaning fluid droplets on the wafer surface especially when used on hydrophobic wafer surfaces. Certain portion of the wafer may have different hydrophobic properties.

FIG. 1B illustrates an exemplary wafer drying process 18. In this example a portion 20 of the wafer 10 has a hydrophilic area and a portion 22 has a hydrophobic area. The portion 20 attracts water so a fluid 26 pools in that area. The portion 22 is hydrophobic so that area repels water and therefore there can be a thinner film of water on that portion of the wafer 10. Therefore, the hydrophobic portions of the wafer 10 often dry more quickly than the hydrophilic portions. This may lead to inconsistent wafer drying that can increase contamination levels and therefore decrease wafer production yields.

Therefore, there is a need for a method and an apparatus that avoids the prior art by enabling optimized fluid management and application to a wafer that reduces contaminating deposits on the wafer surface. Such deposits as often occurs today reduce the yield of acceptable wafers and increase the cost of manufacturing semiconductor wafers.

SUMMARY OF THE INVENTION

Broadly speaking, the present invention fills these needs by providing a substrate processing apparatus that is capable of processing wafer surfaces with an active cavity within a fluid meniscus. In addition, proximity heads generating a fluid meniscus by using self regulation are also provided. It should be appreciated that the present invention can be implemented in numerous ways, including as a process, an apparatus, a system, a device or a method. Several inventive embodiments of the present invention are described below.

In one embodiment, an apparatus for processing a substrate is provided which includes a proximity head proximate to a surface of the substrate when in operation. The apparatus also includes an opening on a surface of the proximity head to a cavity defined in the proximity head where the cavity delivers an active agent to the surface of the substrate through the opening. The apparatus further includes a plurality of conduits on the surface of the proximity head that generates a fluid meniscus on the surface of the substrate surrounding the opening.

In another embodiment, a method for processing a substrate is provided which includes applying an active agent to an active region of a surface of the substrate and generating a fluid meniscus on the surface of the substrate with a proximity head where the fluid meniscus surrounds the active region.

In yet another embodiment, a method for processing a substrate is provided which includes generating a first fluid meniscus on a surface of the substrate and generating a second fluid meniscus on the surface of the substrate where the second fluid meniscus is adjacent to the first fluid meniscus. The generating the first fluid meniscus and the second fluid meniscus includes siphoning at least the first fluid from the first fluid meniscus.

In another embodiment, a method for processing substrate is provided which includes applying a fluid onto a surface of a substrate and siphoning at least the fluid from the surface of the substrate where the removing being processed just as the fluid is applied to the surface of the substrate. The applying and the removing form a fluid meniscus.

In yet another embodiment, a proximity head for processing a substrate is provided which includes at least one first conduit defined within the proximity head where the at least one first conduit applies a fluid to a surface of the substrate. The proximity head includes at least one second conduit defined within the proximity head where the at least one second conduit is in close proximity to the at least one first conduit where the at least one second conduit siphons the fluid from the surface of the wafer. The application of the fluid to the surface of the substrate and siphoning of the fluid from the surface of the substrate generates a fluid meniscus.

The advantages of the present invention are numerous. Most notably, the apparatuses and methods described herein utilize a proximity head with at least one cavity. By using the cavity to apply active agents to the wafer surface, the wafer surface may be processed and then the meniscus surrounding the active cavity may rinse the processed regions. Therefore, the process environment can be powerfully controlled and managed thereby generating more consistent wafer processing. Consequently, wafer processing and production may be increased and higher wafer yields may be achieved due to efficient wafer processing.

In addition, the proximity head described herein may utilize siphon to remove fluid from the fluid meniscus. By utilizing a siphon, meniscus stability and control may be enhanced because the meniscus in such an embodiment may be self regulating. When the flow of fluid into the meniscus is high the siphon removes fluid at a higher rate. Consequently, wafer processing may be made consistent thereby increasing wafer processing yields.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 3 illustrates a proximity head performing a wafer processing operation in accordance with one embodiment of the present invention.

FIG. 12 shows a cross sectional view of a proximity head with the active cavity window in accordance with one embodiment of the present invention.

FIG. 13 illustrates a cross sectional view of a proximity head which includes multiple cavities with multiple menisci in one embodiment of the present invention.

DETAILED DESCRIPTION

Figure 1A:
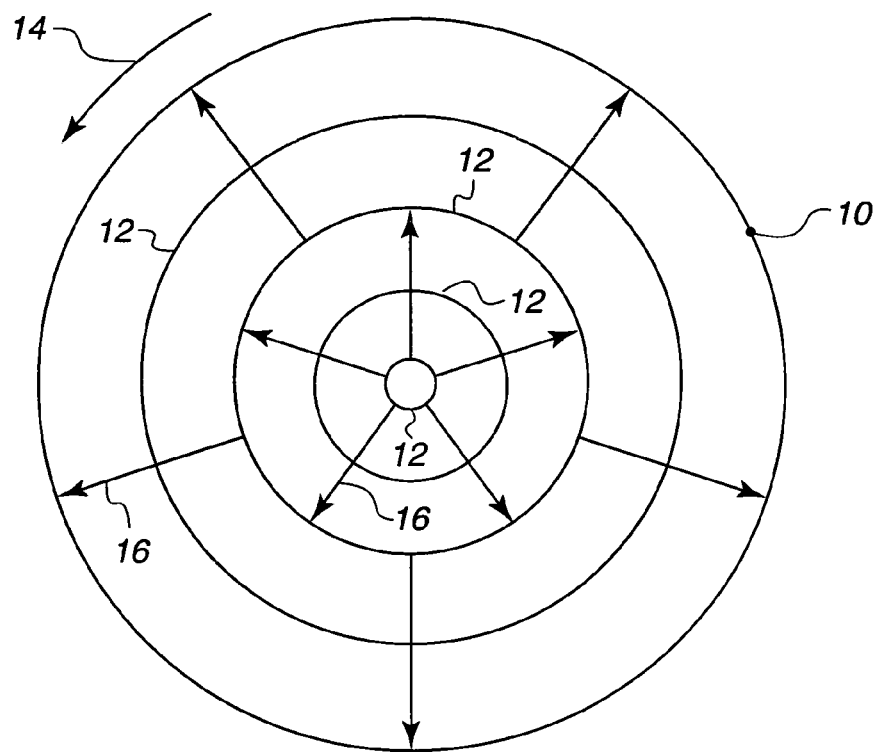
FIG. 1A illustrates movement of cleaning fluids on a wafer during an SRD drying process.
Figure 1B:
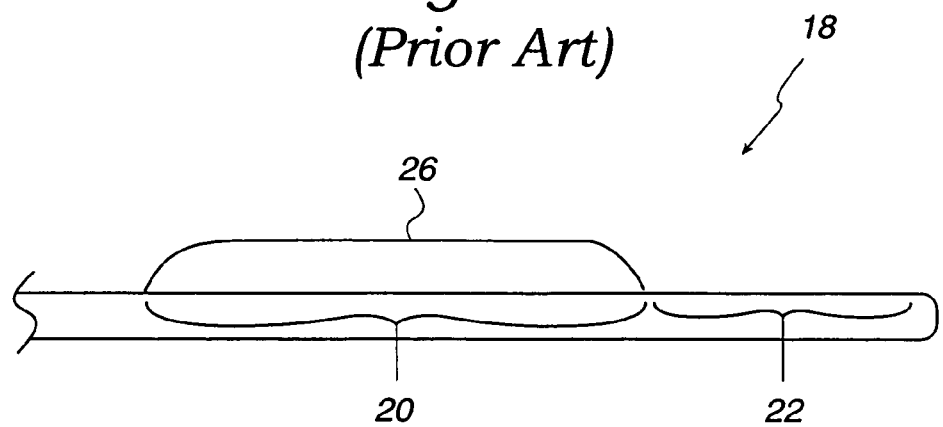
FIG. 1B illustrates an exemplary wafer drying process.

An invention for methods and apparatuses for processing a substrate is disclosed. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention.

While this invention has been described in terms of several preferable embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

The figures below illustrate embodiments of an exemplary wafer processing system using proximity heads to generate any suitable shape, size, and location of the fluid meniscus(es). In one embodiment, the proximity head utilizes siphon to remove fluid(s) from the fluid meniscus. In another embodiment, the proximity head includes an active cavity that is surrounded by a fluid meniscus thereby generating a processing region that is highly controllable. In one embodiment, the region, after processing, can be processed using another wafer processing operation (e.g., rinsing) very soon after the initial processing of the region by the active cavity because the fluid meniscus surrounds the active cavity. This technology may be utilized to perform any suitable type of combination of types of wafer operation(s) such as, for example drying, etching, plating, etc.

It should be appreciated that the systems and proximity heads as described herein are exemplary in nature, and that any other suitable types of configurations that would enable the generation and movement of a meniscus or enable a meniscus with a cavity enclosed therein may be utilized. In the embodiments shown, the proximity head(s) may move in a linear fashion from a center portion of the wafer to the edge of the wafer. It should be appreciated that other embodiments may be utilized where the proximity head(s) move in a linear fashion from one edge of the wafer to another diametrically opposite edge of the wafer, or other non-linear movements may be utilized such as, for example, in a radial motion, in a circular motion, in a spiral motion, in a zig-zag motion, in a random motion, etc. In addition, the motion may also be any suitable specified motion profile as desired by a user. In addition, in one embodiment, the wafer may be rotated and the proximity head moved in a linear fashion so the proximity head may process all portions of the wafer. It should also be understood that other embodiments may be utilized where the wafer is not rotated but the proximity head is configured to move over the wafer in a fashion that enables processing of all portions of the wafer. In other embodiments, either or both of the wafer and the proximity head do not move depending on the wafer processing operation and the configuration of the proximity head. In further embodiments, the proximity head may be held stationary and the wafer may be moved to be processed by the fluid meniscus. As with the proximity head, the wafer may move in any suitable motion as long as the desired wafer processing operation is accomplished.

In addition, the proximity head and the wafer processing system as described herein may be utilized to process any shape and size of substrates such as for example, 200 mm wafers, 300 mm wafers, flat panels, etc. Moreover, the size of the proximity head and in turn the sizes of the menisci may vary. In one embodiment, the size of the proximity head and the sizes of the menisci may be larger than a wafer being processed, and in another embodiment, the proximity head and the sizes of the menisci may be smaller than the wafer being processed. Furthermore, the menisci as discussed herein may be utilized with other forms of wafer processing technologies such as, for example, brushing, lithography, megasonics, etc.

A fluid meniscus can be supported and moved (e.g., onto, off of and across a wafer) with a proximity head. Various proximity heads and methods of using the proximity heads are described in co-owned U.S. patent application Ser. No. 10/834,548 filed on Apr. 28, 2004 and entitled "Apparatus and Method for Providing a Confined Liquid for Immersion Lithography," which is a continuation in part of U.S. patent application Ser. No. 10/606,022, filed on Jun. 24, 2003 and entitled "System And Method For Integrating In-Situ Metrology Within A Wafer Process" which is a continuation-in-part of U.S. patent application Ser. No. 10/330,843 filed on Dec. 24, 2002 and entitled "Meniscus, Vacuum, IPA Vapor, Drying Manifold," which is a continuation-in-part of U.S. patent application Ser. No. 10/261,839 filed on Sep. 30, 2002 and entitled "Method and Apparatus for Drying Semiconductor Wafer Surfaces Using a Plurality of Inlets and Outlets Held in Close Proximity to the Wafer Surfaces," both of which are incorporated herein by reference in its entirety. Additional embodiments and uses of the proximity head are also disclosed in U.S. patent application Ser. No. 10/330,897, filed on Dec. 24, 2002, entitled "System for Substrate Processing with Meniscus, Vacuum, IPA vapor, Drying Manifold" and U.S. patent application Ser. No. 10/404,692, filed on Mar. 31, 2003, entitled "Methods and Systems for Processing a Substrate Using a Dynamic Liquid Meniscus." Still additional embodiments of the proximity head are described in U.S. patent application Ser. No. 10/404,270, filed on Mar. 31, 2003, entitled "Vertical Proximity Processor," U.S. patent application Ser. No. 10/603,427, filed on Jun. 24, 2003, and entitled "Methods and Systems for Processing a Bevel Edge of a Substrate Using a Dynamic Liquid Meniscus," U.S. patent application Ser. No. 10/606,022, filed on Jun. 24, 2003, and entitled "System and Method for Integrating In-Situ Metrology within a Wafer Process," U.S. patent application Ser. No. 10/607,611 filed on Jun. 27, 2003 entitled "Apparatus and Method for Depositing and Planarizing Thin Films of Semiconductor Wafers," U.S. patent application Ser. No. 10/611,140 filed on Jun. 30, 2003 entitled "Method and Apparatus for Cleaning a Substrate Using Megasonic Power," U.S. patent application Ser. No. 10/817,398 filed on Apr. 1, 2004 entitled "Controls of Ambient Environment During Wafer Drying Using Proximity Head," U.S. patent application Ser. No. 10/817,355 filed on Apr. 1, 2004 entitled "Substrate Proximity Processing Structures and Methods for Using and Making the Same," U.S. patent application Ser. No. 10/817,620 filed on Apr. 1, 2004 entitled "Substrate Meniscus Interface and Methods for Operation," U.S. patent application Ser. No. 10/817,133 filed on Apr. 1, 2004 entitled "Proximity Meniscus Manifold," U.S. Pat. No. 6,488,040, issued on Dec. 3, 2002, entitled "Capillary Proximity Heads For Single Wafer Cleaning And Drying," U.S. Pat. No. 6,616,772, issued on Sep. 9, 2003, entitled "Methods For Wafer Proximity Cleaning And Drying," and U.S. patent application Ser. No. 10/742,303 entitled "Proximity Brush Unit Apparatus and Method." Additional embodiments and uses of the proximity head are further described in U.S. patent application Ser. No. 10/883,301 entitled "Concentric Proximity Processing Head," and U.S. patent application Ser. No. 10/882,835 entitled "Method and Apparatus for Processing Wafer Surfaces Using Thin, High Velocity Fluid Layer." The aforementioned patent applications are hereby incorporated by reference in their entirety.

It should be appreciated that the system described herein is just exemplary in nature, and the proximity head described herein may be used in any suitable system such as, for example, those described in the United States Patent Applications referenced above. It should also be appreciated that FIGS. 2 through 8 describe formation of a meniscus which may use a siphon to remove fluid from the wafer surface and therefore process variables (e.g. flow rates, dimensions, etc.) described therein may be different than the process variables described for a proximity head with an active cavity as described in FIGS. 9 through 15B. It should also be appreciated that the siphoning may be applied to any suitable proximity head described herein.

Figure 2:
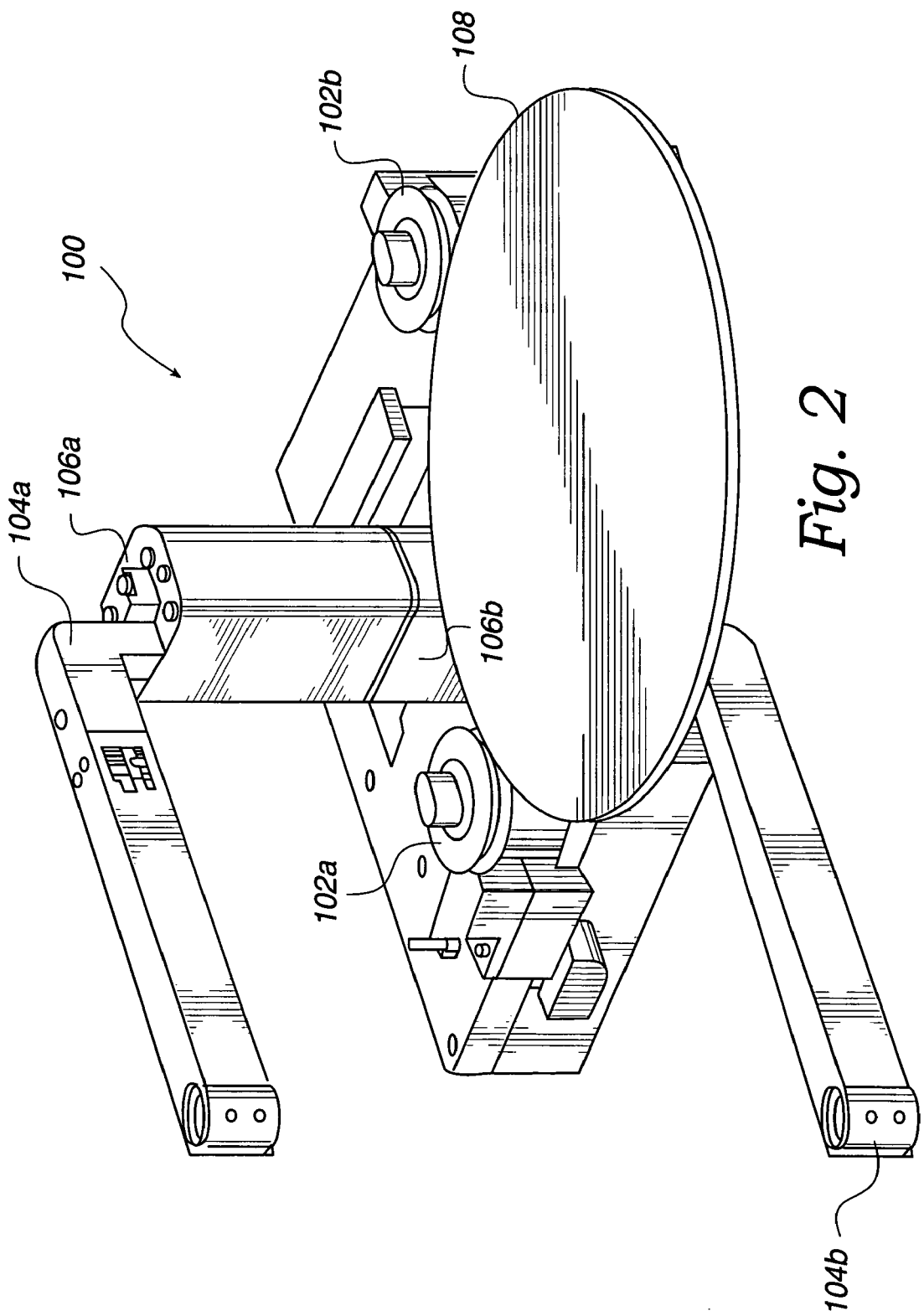
FIG. 2 shows a wafer processing system in accordance with one embodiment of the present invention.

FIG. 2 shows a wafer processing system 100 in accordance with one embodiment of the present invention. The system 100 includes rollers 102a and 102b which may hold and/or rotate a wafer to enable wafer surfaces to be processed. The system 100 also includes proximity heads 106a and 106b that, in one embodiment, are attached to an upper arm 104a and to a lower arm 104b respectively. In one embodiment, the proximity heads 106a and/or 106b may be any suitable proximity heads as described in further detail in reference to FIGS. 2 through 15 described herein. As described herein the term "multi-menisci proximity head" is a proximity head capable of generating one or more fluid menisci. In a one embodiment, a first fluid meniscus is substantially surrounded by a second fluid meniscus. In one, the first fluid meniscus and the second fluid meniscus are concentric with the second fluid meniscus surrounding the first fluid meniscus. The proximity head may be any suitable apparatus that may generate a fluid meniscus as described herein and described in the patent application incorporated by reference above. The upper arm 104a and the lower arm 104b can be part of an assembly which enables substantially linear movement (or in another embodiment a slight arc-like movement) of the proximity heads 106a and 106b along a radius of the wafer. In yet another embodiment, the assembly may move the proximity heads 106a and 106b in any suitable user defined movement.

In one embodiment the arms 104 are configured to hold the proximity head 106a above the wafer and the proximity head 106b below the wafer in close proximity to the wafer. For example, in one exemplary embodiment this may be accomplished by having the upper arm 104a and the lower arm 104b be movable in a vertical manner so once the proximity heads are moved horizontally into a location to start wafer processing, the proximity heads 106a and 106b can be moved vertically to a position in close proximity to the wafer. In another embodiment, the upper arm 104a and the lower arm 104b may be configured to start the proximity heads 106a and 106b in a position where the menisci are generated before processing and the menisci that has already been generated between the proximity heads 106a and 106b may be moved onto the wafer surface to be processed from an edge area of a wafer 108. Therefore, the upper arm 104a and the lower arm 104b may be configured in any suitable way so the proximity heads 106a and 106b can be moved to enable wafer processing as described herein. It should also be appreciated that the system 100 may be configured in any suitable manner as long as the proximity head(s) may be moved in close proximity to the wafer to generate and control multiple meniscus that, in one embodiment, are concentric with each other. It should also be understood that close proximity may be any suitable distance from the wafer as long as a menisci may be maintained. In one embodiment, the proximity heads 106a and 106b (as well as any other proximity head described herein) may each be located between about 0.1 mm to about 10 mm from the wafer to generate the fluid menisci on the wafer surface. In a preferable embodiment, the proximity heads 106a and 106b (as well as any other proximity head described herein) may each be located bout 0.5 mm to about 2.0 mm from the wafer to generate the fluid menisci on the wafer surface, and in more preferable embodiment, the proximity heads 106a and 106b (as well as any other proximity head described herein) may be located about 1.5 mm from the wafer to generate the fluid menisci on the wafer surface.

In one embodiment, the system 100, the arms 104 are configured to enable the proximity heads 106a and 106b to be moved from processed to unprocessed portions of the wafer. It should be appreciated that the arms 104 may be movable in any suitable manner that would enable movement of the proximity heads 106a and 106b to process the wafer as desired. In one embodiment, the arms 104 may be motivated by a motor to move the proximity head 106a and 106b along the surface of the wafer. It should be understood that although the wafer processing system 100 is shown with the proximity heads 106a and 106b, that any suitable number of proximity heads may be utilized such as, for example, 1, 2, 3, 4, 5, 6, etc. The proximity heads 106a and/or 106b of the wafer processing system 100 may also be any suitable size or shape as shown by, for example, any of the proximity heads as described herein. The different configurations described herein generate the fluid menisci between the proximity head and the wafer. The fluid menisci may be moved across the wafer to process the wafer by applying fluid to the wafer surface and removing fluids from the surface. In such a way, depending on the fluids applied to the wafer, cleaning, drying, etching, and/or plating may be accomplished. In addition, the first fluid meniscus may conduct one type of operation and the second fluid meniscus that at least partially surrounds the first fluid meniscus may conduct the same operation or a different wafer processing operation as the first fluid meniscus. Therefore, the proximity heads 106a and 106b can have any numerous types of configurations as shown herein or other configurations that enable the processes described herein. It should also be appreciated that the system 100 may process one surface of the wafer or both the top surface and the bottom surface of the wafer.

In addition, besides processing the top and/or bottom surfaces of the wafer, the system 100 may also be configured to process one side of the wafer with one type of process (e.g., etching, cleaning, drying, plating, etc.) and process the other side of the wafer using the same process or a different type of process by inputting and outputting different types of fluids or by using a different configuration menisci. The proximity heads can also be configured to process the bevel edge of the wafer in addition to processing the top and/or bottom of the wafer. This can be accomplished by moving the menisci off (or onto) the edge the wafer which processes the bevel edge. It should also be understood that the proximity heads 106a and 106b may be the same type of apparatus or different types of proximity heads.

The wafer 108 may be held and rotated by the rollers 102a and 102b in any suitable orientation as long as the orientation enables a desired proximity head to be in close proximity to a portion of the wafer 108 that is to be processed. In one embodiment, the rollers 102a and 102b can rotate in a clockwise direction to rotate the wafer 108 in a counter-clockwise direction. It should be understood that the rollers may be rotated in either a clockwise or a counterclockwise direction depending on the wafer rotation desired. In one embodiment, the rotation imparted on the wafer 108 by the rollers 102a and 102b serves to move a wafer area that has not been processed into close proximity to the proximity heads 106a and 106b. However, the rotation itself does not dry the wafer or move fluid on the wafer surfaces towards the edge of the wafer. Therefore, in an exemplary wafer processing operation, the unprocessed areas of the wafer would be presented to the proximity heads 106a and 106b through both the linear motion of the proximity heads 106a and 106b and through the rotation of the wafer 108. The wafer processing operation itself may be conducted by at least one of the proximity heads. Consequently, in one embodiment, processed portions of the wafer 108 would expand from a center region to the edge region of the wafer 108 in a spiral movement as the processing operation progresses. In another embodiment, when the proximity heads 106a and 106b are moved from the periphery of the wafer 108 to the center of the wafer 108, the processed portions of the wafer 108 would expand from the edge region of the wafer 108 to the center region of the wafer 108 in a spiral movement.

In an exemplary processing operation, it should be understood that the proximity heads 106a and 106b may be configured to dry, clean, etch, and/or plate the wafer 108. In an exemplary drying embodiment, the at least one of first inlet may be configured to input deionized water (DIW) (also known as a DIW inlet), the at least one of a second inlet may be configured to input $N_2$ carrier gas containing isopropyl alcohol (IPA) in vapor form (also known as IPA inlet), and the at least one outlet may be configured to remove fluids from a region between the wafer and a particular proximity head. It should be appreciated that the removal of fluids may be accomplished by any suitable method whereby fluid is removed in an efficient manner consistent with the methodologies described herein. In one embodiment, vacuum may be applied through the at least one outlet (also known as vacuum outlet). In another embodiment, where the at least one outlet removes substantially single phase fluids (e.g., mostly liquid), then a method such as siphon may be utilized. Siphoning of fluid through the at least one outlet is described in further detail in reference to FIG. 8. It should be appreciated that although IPA vapor is used in some of the exemplary embodiments, any other type of vapor may be utilized such as for example, nitrogen, any suitable alcohol vapor, organic compounds, volatile chemicals, etc. that may be miscible with water.

In an exemplary cleaning embodiment, a cleaning solution may be substituted for the DIW. An exemplary etching embodiment may be conducted where an etchant may be substituted for the DIW. In an additional embodiment, plating may be accomplished as described in further detail in reference to U.S. patent application Ser. No. 10/607,611 filed on Jun. 27, 2003 entitled "Apparatus and Method for Depositing and Planarizing Thin Films of Semiconductor Wafers" which was incorporated by reference above. In addition, other types of solutions may be inputted into the first inlet and the second inlet depending on the processing operation desired.

It should be appreciated that the inlets and outlets located on a face of the proximity head may be in any suitable configuration as long as stable menisci as described herein may be utilized. In one embodiment, the at least one $N_2$/IPA vapor inlet may be adjacent to the at least one vacuum outlet which is in turn adjacent to the at least one processing fluid inlet to form an IPA-vacuum-processing fluid orientation. Such a configuration can generate an outside meniscus that at least partially surrounds the inside meniscus. In addition, the inside meniscus may be generated through a configuration with a processing fluid-vacuum orientation. Therefore, one exemplary embodiment where a second fluid meniscus at least partially surrounds a first fluid meniscus may be generated by an IPA-vacuum-second processing fluid-vacuum-first processing fluid-vacuum-second processing fluid-vacuum-IPA orientation as described in further detail below. It should be appreciated that other types of orientation combinations such as IPA-processing fluid-vacuum, processing fluid-vacuum-IPA, vacuum-IPA-processing fluid, etc. may be utilized depending on the wafer processes desired and what type of wafer processing mechanism is sought to be enhanced. In one embodiment, the IPA-vacuum-processing fluid orientation may be utilized to intelligently and powerfully generate, control, and move the menisci located between a proximity head and a wafer to process wafers. The processing fluid inlets, the $N_2$/IPA vapor inlets, and the vacuum outlets may be arranged in any suitable manner if the above orientation is maintained. For example, in addition to the $N_2$/IPA vapor inlet, the vacuum outlet, and the processing fluid inlet, in an additional embodiment, there may be additional sets of IPA vapor outlets, processing fluid inlets and/or vacuum outlets depending on the configuration of the proximity head desired. It should be appreciated that the exact configuration of the inlet and outlet orientation may be varied depending on the application. For example, the distance between the IPA input, vacuum, and processing fluid inlet locations may be varied so the distances are consistent or so the distances are inconsistent. In addition, the distances between the IPA input, vacuum, and processing fluid outlet may differ in magnitude depending on the size, shape, and configuration of the proximity head 106a and the desired size of a process menisci (i.e., menisci shape and size). In addition, exemplary IPA-vacuum-processing fluid orientation may be found as described in the United States Patent Applications referenced above. It should be appreciated that anywhere vacuum is utilized to remove fluid from the wafer surface, siphoning as described in further detail in reference to FIG. 8 may be utilized for substantially single phase fluids.

In one embodiment, the proximity heads 106a and 106b may be positioned in close proximity to a top surface and a bottom surface respectively of the wafer 108 and may utilize the IPA and DIW inlets and a vacuum outlets as described herein to generate wafer processing menisci in contact with the wafer 108 which are capable of processing the top surface and the bottom surface of the wafer 108. The wafer processing menisci may be generated in a manner consistent with the descriptions in reference to Applications referenced and incorporated by reference above. At substantially the same time the IPA and the processing fluid is inputted, a vacuum may be applied in close proximity to the wafer surface to remove the IPA vapor, the processing fluid, and/or the fluids that may be on the wafer surface. It should be appreciated that although IPA is utilized in the exemplary embodiment, any other suitable type of vapor may be utilized such as for example, nitrogen, any suitable alcohol vapor, organic compounds, hexanol, ethyl glycol, acetone, etc. that may be miscible with water. These fluids may also be known as surface tension reducing fluids. The portion of the processing fluid that is in the region between the proximity head and the wafer is the menisci. It should be appreciated that as used herein, the term "output" can refer to the removal of fluid from a region between the wafer 108 and a particular proximity head, and the term "input" can be the introduction of fluid to the region between the wafer 108 and the particular proximity head. In another embodiment, the proximity heads 106a and 106b may be scanned over the wafer 108 while being moved at the end of an arm that is being moved in a slight arc.

FIG. 3 illustrates a proximity head 106 performing a wafer processing operation in accordance with one embodiment of the present invention. FIGS. 3 through 4B show a method of generating a basic fluid meniscus while FIGS. 5A through 15B discuss apparatuses and methods for generating a more complex menisci configuration. The proximity head 106, in one embodiment, moves while in close proximity to a top surface 108a of the wafer 108 to conduct a wafer processing operation. It should be appreciated that the proximity head 106 may also be utilized to process (e.g., clean, dry, plate, etch, etc.) a bottom surface 108b of the wafer 108. In one embodiment, the wafer 108 is rotating so the proximity head 106 may be moved in a linear fashion along the head motion while the top surface 108a is being processed. By applying the IPA 310 through the inlet 302, the vacuum 312 through outlet 304, and the processing fluid 314 through the inlet 306, the meniscus 116 may be generated. It should be appreciated that the orientation of the inlets/outlets as shown in FIG. 3 is only exemplary in nature, and that any suitable inlets/outlets orientation that may produce a stable fluid meniscus may be utilized such as those configurations as described in the United States Patent Applications incorporated by reference previously.

Figure 4A:
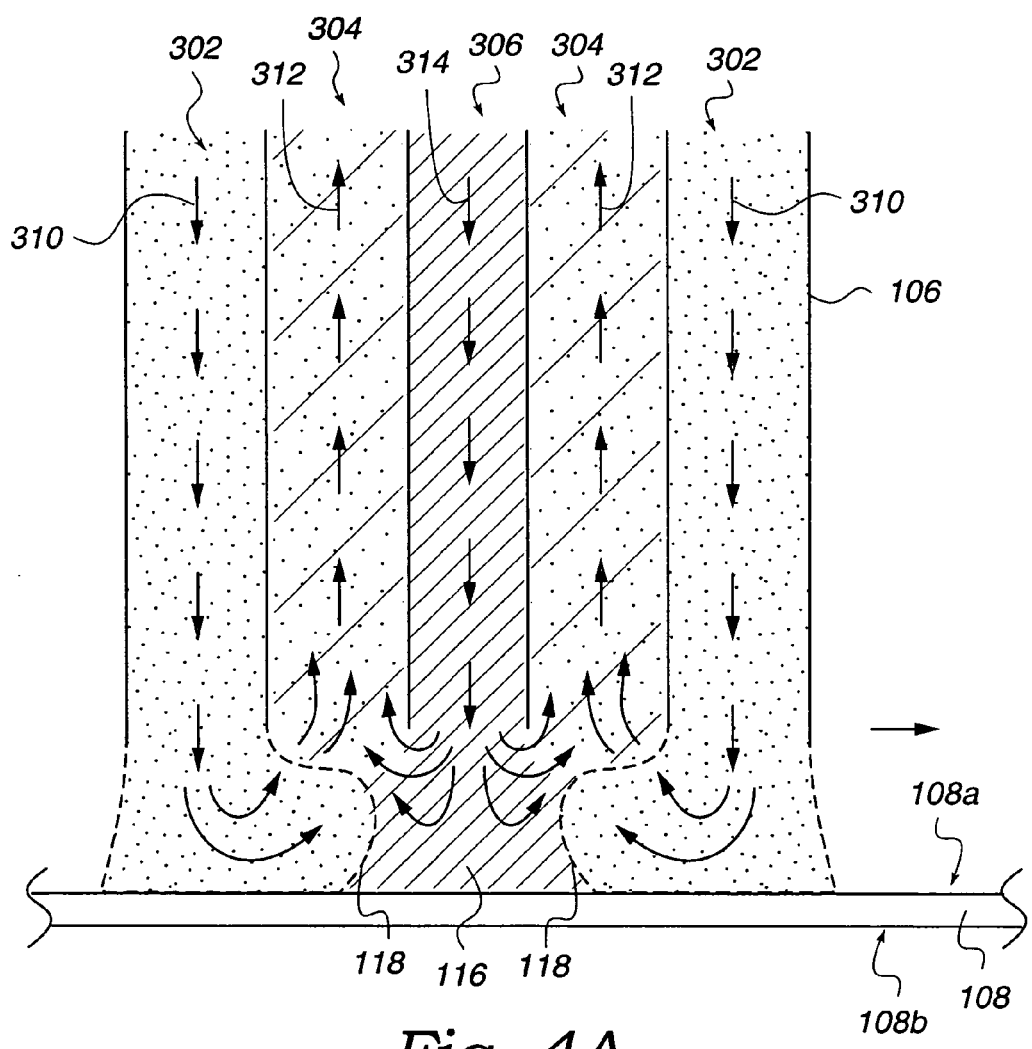
FIG. 4A illustrates a wafer processing operation that may be conducted by a proximity head in accordance with one embodiment of the present invention.
Figure 4B:
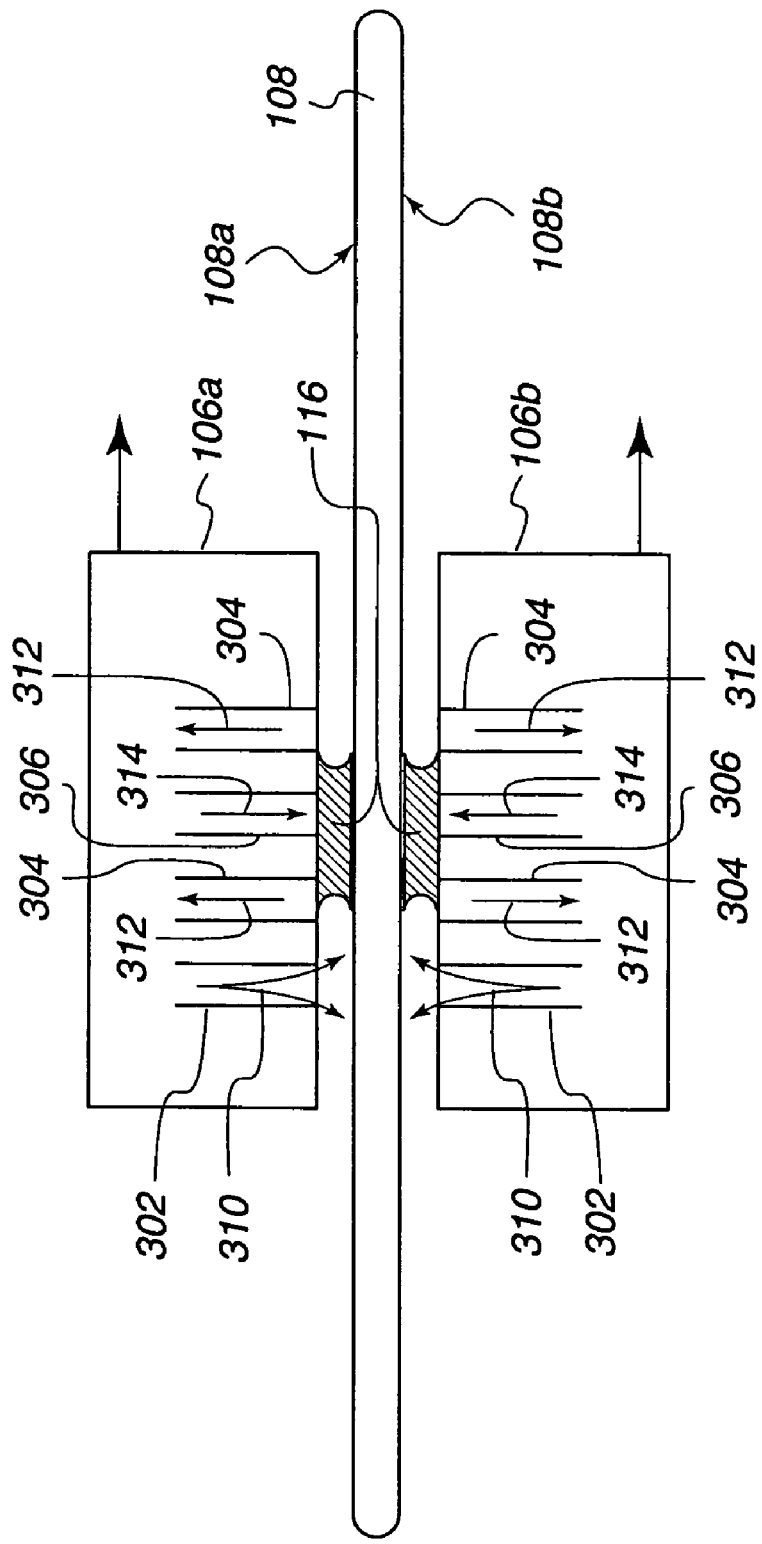
FIG. 4B illustrates a side view of exemplary proximity heads for use in a dual wafer surface processing system in accordance with one embodiment of the present invention.

FIG. 4A illustrates a wafer processing operation that may be conducted by a proximity head 106a in accordance with one embodiment of the present invention. Although FIG. 4A shows a top surface 108a being processed, it should be appreciated that the wafer processing may be accomplished in substantially the same way for the bottom surface 108b of the wafer 108. In one embodiment, the inlet 302 may be utilized to apply isopropyl alcohol (IPA) vapor toward a top surface 108a of the wafer 108, and the inlet 306 may be utilized to apply a processing fluid toward the top surface 108a of the wafer 108. In addition, the outlet 304 may be utilized to apply vacuum to a region in close proximity to the wafer surface to remove fluid or vapor that may located on or near the top surface 108a. As described above, it should be appreciated that any suitable combination of inlets and outlets may be utilized as long as the meniscus 116 may be formed. The IPA may be in any suitable form such as, for example, IPA vapor where IPA in vapor form is inputted through use of a $N_2$ gas. Moreover, any suitable fluid used for processing the wafer (e.g., cleaning fluid, drying fluid, etching fluid, plating fluid, etc.) may be utilized that may enable or enhance the wafer processing. In one embodiment, an IPA inflow 310 is provided through the inlet 302, a vacuum 312 may be applied through the outlet 304 and processing fluid inflow 314 may be provided through the inlet 306. Consequently, if a fluid film resides on the wafer 108, a first fluid pressure may be applied to the wafer surface by the IPA inflow 310, a second fluid pressure may be applied to the wafer surface by the processing fluid inflow 314, and a third fluid pressure may be applied by the vacuum 312 to remove the processing fluid, IPA and the fluid film on the wafer surface.

Therefore, in one embodiment of a wafer processing, as the processing fluid inflow 314 and the IPA inflow 310 is applied toward a wafer surface, fluid (if any) on the wafer surface is intermixed with the processing inflow 314. At this time, the processing fluid inflow 314 that is applied toward the wafer surface encounters the IPA inflow 310. The IPA forms an interface 118 (also known as an IPA/processing fluid interface 118) with the processing fluid inflow 314 and along with the vacuum 312 assists in the removal of the processing fluid inflow 314 along with any other fluid from the surface of the wafer 108. In one embodiment, the IPA/processing fluid interface 118 reduces the surface of tension of the processing fluid. In operation, the processing fluid is applied toward the wafer surface and almost immediately removed along with fluid on the wafer surface by the vacuum applied by the outlet 304. The processing that is applied toward the wafer surface and for a moment resides in the region between a proximity head and the wafer surface along with any fluid on the wafer surface forms a meniscus 116 where the borders of the meniscus 116 are the IPA/processing fluid interfaces 118. Therefore, the meniscus 116 is a constant flow of fluid being applied toward the surface and being removed at substantially the same time with any fluid on the wafer surface. The nearly immediate removal of the processing fluid from the wafer surface prevents the formation of fluid droplets on the region of the wafer surface being dried thereby reducing the possibility of contamination on the wafer 108 after the processing fluid has accomplished its purpose depending on the operation (e.g., etching, cleaning, drying, plating, etc.). The pressure (which is caused by the flow rate of the IPA) of the downward injection of IPA also helps contain the meniscus 116.

The flow rate of the N2 carrier gas containing the IPA may assist in causing a shift or a push of processing fluid flow out of the region between the proximity head and the wafer surface and into the outlets 304 (vacuum outlets) through which the fluids may be outputted from the proximity head. It is noted that the push of processing fluid flow is not a process requirement but can be used to optimize meniscus boundary control. Therefore, as the IPA and the processing fluid are pulled into the outlets 304, the boundary making up the IPA/processing fluid interface 118 is not a continuous boundary because gas (e.g., air) is being pulled into the outlets 304 along with the fluids. In one embodiment, as the vacuum from the outlets 304 pulls the processing fluid, IPA, and the fluid on the wafer surface, the flow into the outlets 304 is discontinuous. This flow discontinuity is analogous to fluid and gas being pulled up through a straw when a vacuum is exerted on combination of fluid and gas. Consequently, as the proximity head 106a moves, the meniscus moves along with the proximity head, and the region previously occupied by the meniscus has been dried due to the movement of the EPA/processing fluid interface 118. It should also be understood that the any suitable number of inlets 302, outlets 304 and inlets 306 may be utilized depending on the configuration of the apparatus and the meniscus size and shape desired. In another embodiment, the liquid flow rates and the vacuum flow rates are such that the total liquid flow into the vacuum outlet is continuous, so no gas flows into the vacuum outlet.

It should be appreciated any suitable flow rate may be utilized for the $N_2$/IPA, processing fluid, and vacuum as long as the meniscus 116 can be maintained. In one embodiment, the flow rate of the processing fluid through a set of the inlets 306 is between about 25 ml per minute to about 3,000 ml per minute. In a preferable embodiment, the flow rate of the processing fluid through the set of the inlets 306 is about 800 ml per minute. It should be understood that the flow rate of fluids may vary depending on the size of the proximity head. In one embodiment a larger head may have a greater rate of fluid flow than smaller proximity heads. This may occur because larger proximity heads, in one embodiment, have more inlets 302 and 306 and outlets 304.

In one embodiment, the flow rate of the $N_2$/IPA vapor through a set of the inlets 302 is between about 1 liters per minute (SLPM) to about 100 SLPM. In a preferable embodiment, the IPA flow rate is between about 6 and 20 SLPM.

In one embodiment, the flow rate for the vacuum through a set of the outlets 304 is between about 10 standard cubic feet per hour (SCFH) to about 1250 SCFH. In a preferable embodiment, the flow rate for a vacuum though the set of the outlets 304 is about 350 SCFH. In an exemplary embodiment, a flow meter may be utilized to measure the flow rate of the $N_2$/IPA, processing fluid, and the vacuum.

It should be appreciated that any suitable type of wafer processing operation may be conducted using the meniscus depending on the processing fluid utilized. For example, a cleaning fluid such as, for example, SC-1, SC-2, etc., may be used for the processing fluid to generate wafer cleaning operation. In a similar fashion, different fluids may be utilized and similar inlet and outlet configurations may be utilized so the wafer processing meniscus may also etch and/or plate the wafer. In one embodiment, etching fluids such as, for example, HF, EKC proprietary solution, KOH etc., may be utilized to etch the wafer. In another embodiment, plating fluids such as, for example, Cu Sulfate, Au Chloride, Ag Sulfate, etc. in conjunction with electrical input may be conducted.

FIG. 4B illustrates a side view of exemplary proximity heads 106a and 106b for use in a dual wafer surface processing system in accordance with one embodiment of the present invention. In this embodiment, by usage of inlets 302 and 306 to input $N_2$/IPA and processing fluid respectively along with the outlet 304 to provide a vacuum, the meniscus 116 may be generated. In addition, on the side of the inlet 306 opposite that of the inlet 302, there may be a outlet 304 to remove processing fluid and to keep the meniscus 116 intact. As discussed above, in one embodiment, the inlets 302 and 306 may be utilized for IPA inflow 310 and processing fluid inflow 314 respectively while the outlet 304 may be utilized to apply vacuum 312. In addition, in yet more embodiments, the proximity heads 106a and 106b may be of a configuration as shown in the United States Patent Applications referenced above. Any suitable surface coming into contact with the meniscus 116 such as, for example, wafer surfaces 108a and 108b of the wafer 108 may be processed by the movement of the meniscus 116 into and away from the surface.

FIGS. 5A through 7 show embodiments of the present invention where a first fluid meniscus is at least partially surrounded by at least a second fluid meniscus. It should be appreciated that the first fluid meniscus and/or the second fluid meniscus may be generated to conduct any suitable type of substrate/wafer processing operation such as, for example, lithography, etching, plating, cleaning, and drying. The first fluid meniscus and the second fluid meniscus may be any suitable shape or size depending on the substrate processing operation desired. In certain embodiments described herein, the first fluid meniscus and the second fluid meniscus are concentric where the second fluid meniscus surrounds the first fluid meniscus and the first fluid meniscus and the second fluid meniscus provide a continuous fluid connection. Therefore, after the first fluid meniscus processes the substrate, the portion of the wafer processed by the first fluid meniscus is immediately processed by the second fluid meniscus without a substantial amount of the contact with the atmosphere. It should be appreciated that depending on the operation desired, in one embodiment, the first fluid meniscus may contact the second meniscus and in another embodiment, the first fluid meniscus does not directly contact the second meniscus.

Figure 5A:
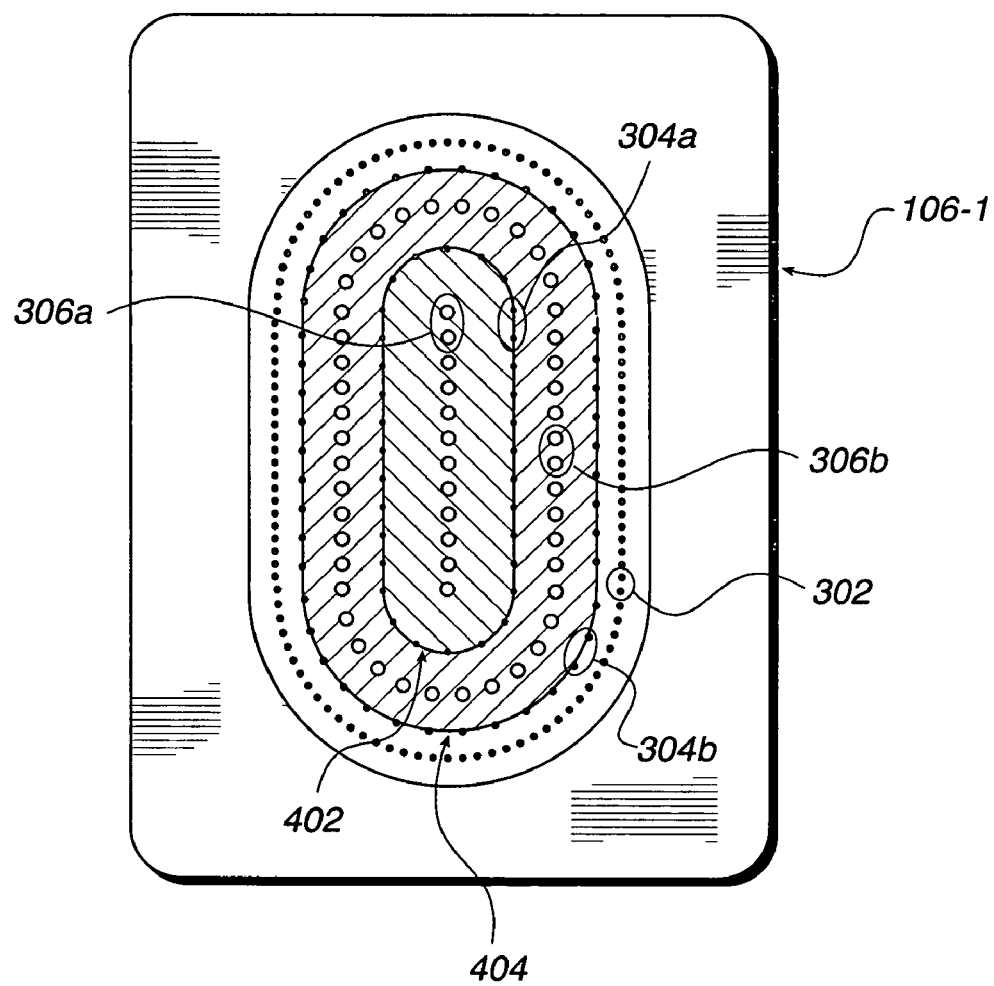
FIG. 5A shows a multi-menisci proximity head in accordance with on embodiment of the present invention.

FIG. 5A shows a multi-menisci proximity head 106-1 in accordance with on embodiment of the present invention. The multi-menisci proximity head 106-1 includes a plurality of source inlets 306a that can apply a first fluid to the wafer surface. The first fluid can then be removed from the wafer surface by application of siphon or vacuum through a plurality of source outlets 304a. Therefore, the first fluid meniscus may be generated by the conduits located within a first fluid meniscus region 402 of the processing surface on the multi-menisci proximity head 106-1.

The multi-menisci proximity head 106-1 may also include a plurality of source inlets 306b that can apply a second fluid to the wafer surface. The second fluid can then be removed from the wafer surface by application of vacuum through a plurality of source outlets 304b. In one embodiment, a portion of the second fluid is also removed by the plurality of source outlets 304a in conjunction with the removal of the first fluid. In one embodiment, the plurality of source outlets 304a may be called a one phase fluid removal conduit because the outlets 304a remove liquids applied to the wafer through the source inlets 306a and 306b. In such one phase removal, siphoning and/or vacuum may be utilized. When siphoning is used, the meniscus may be self regulated because as more fluid is applied to the wafer surface, the more the fluid is removed from the wafer surface through siphon. Therefore, even at variable flow rates, the siphoning can increase or decrease fluid removal rate depending on the flow rates into the fluid meniscus(es). Siphoning with regard to single phase fluid removal from the wafer surface (e.g., from the meniscus(es) on the wafer surface) is described in further detail in reference to FIG. 8.

In addition, the plurality of source outlets 306*b* may be called a two phase removal conduit because the outlets 304*b* removes the second fluid from the source inlets 304*b* and the atmosphere outside of the fluid meniscus. Therefore, in one embodiment, the outlets 304*b* removes both liquid and gas while the outlets 304*a* remove only liquids. As a result, the second fluid meniscus may be created by the conduits located within a second fluid meniscus region 404 of the processing surface on the multi-meniscus proximity head 106-1.

Optionally, the multi-menisci proximity head 106-1 may include a plurality of source inlets 302 which can apply a third fluid to the wafer surface. In one embodiment, the third fluid may be a surface tension reducing fluid that can reduce the surface tension of a liquid/atmosphere border of the second meniscus formed by that application of the second fluid to the wafer surface.

In addition, the processing surface (e.g., the surface area of the multi-menisci proximity head where the conduits exist) of the multi-menisci proximity head 106-1 (or any other proximity head discussed herein) may be of any suitable topography such as, for example, flat, raised, lowered. In one embodiment, the processing surface of the multi-menisci 106-1 may have a substantially flat surface.

Figure 5B:
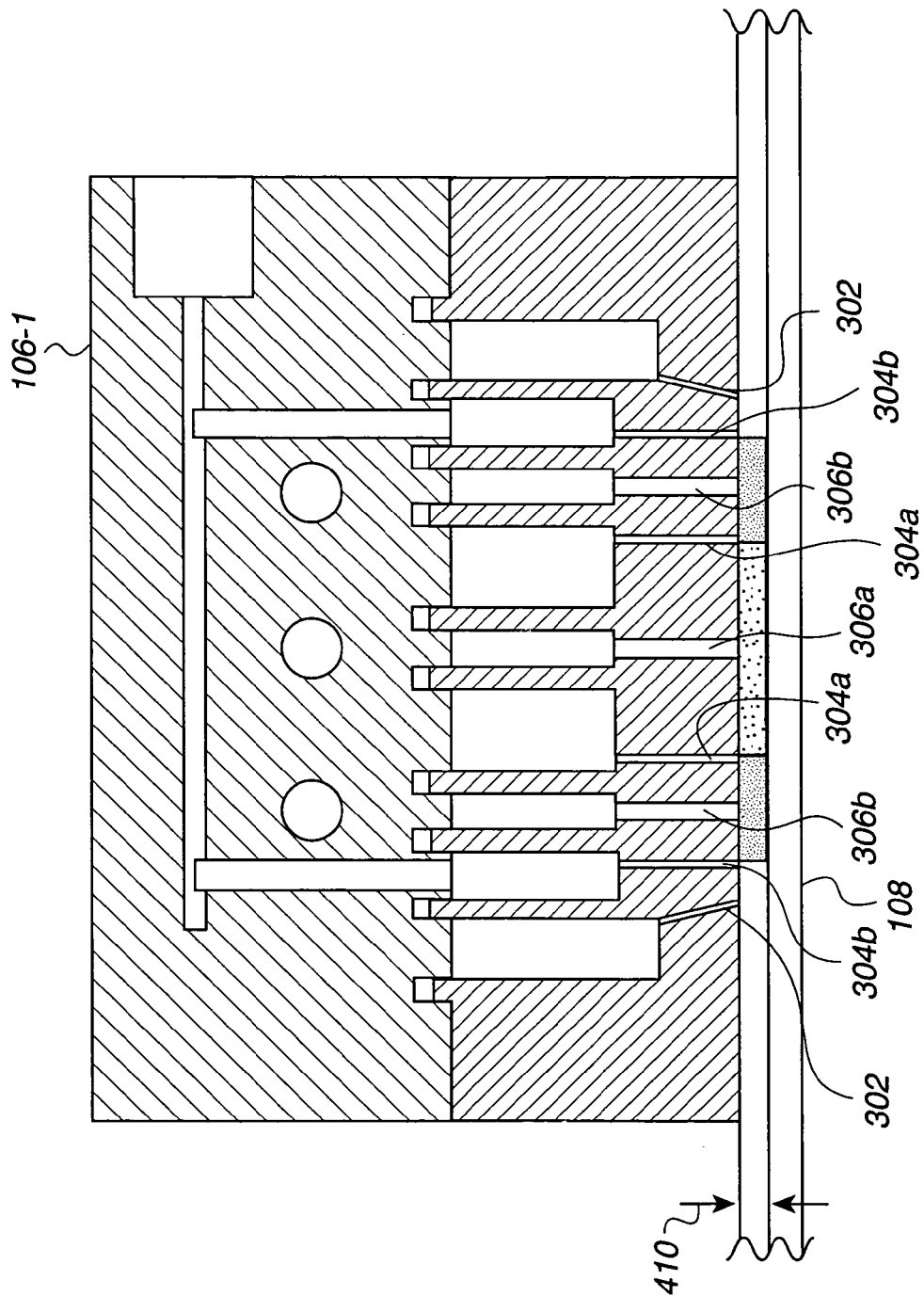
FIG. 5B shows a cross section view of the multi-menisci proximity head in accordance with one embodiment of the present invention.

FIG. 5B shows a cross section view of the multi-menisci proximity head 106-1 in accordance with one embodiment of the present invention. The multi-menisci proximity head 106-1 can apply the first fluid through the plurality of source inlets 306*a* and remove the first fluid through the plurality of source outlets 304*a* through use of siphoning and/or vacuum. The first fluid meniscus 116*a* is located underneath a region substantially surrounded by the plurality of source outlets 304*a*. The multi-menisci proximity head 106-1 can also apply the second fluid through the plurality of source inlets 306*b* and remove the second fluid through the plurality of source outlets 304*a* on one side of the second fluid meniscus and 304*b* on the other side. In one embodiment, the plurality of source inlets 302 may apply the third fluid to decrease the surface tension of the fluid making up the second fluid meniscus 116*b*. The plurality of source inlets 302 may be optionally angled to better confine the second fluid meniscus 1116*b*.

Figure 6A:
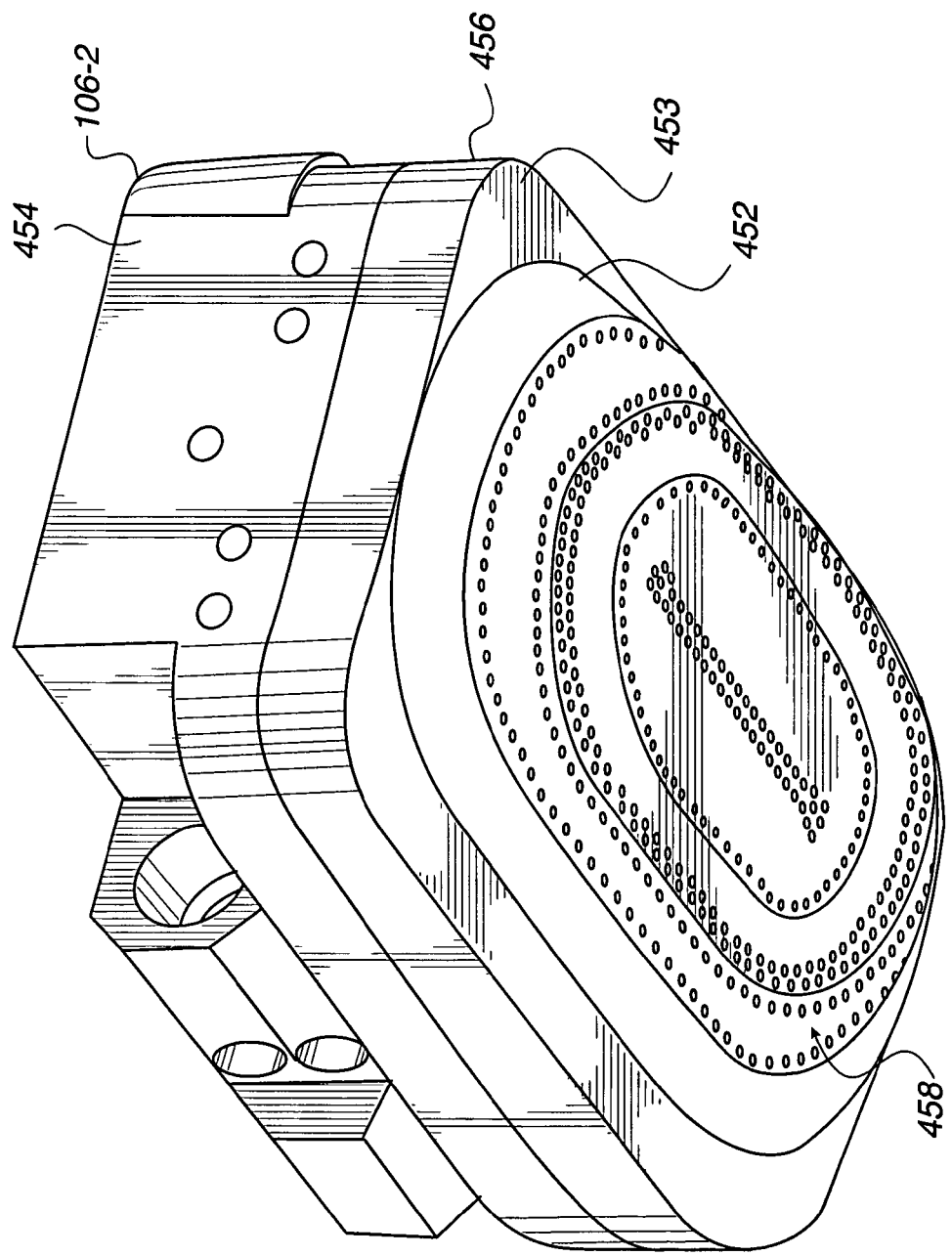
FIG. 6A illustrates a multi-menisci proximity head in accordance with one embodiment of the present invention.

FIG. 6A illustrates a multi-menisci proximity head 106-2 in accordance with one embodiment of the present invention. The proximity head 106-2 includes, in one embodiment, a facilities plate 454 and a body 458. It should be appreciated the proximity head 106-2 may include any suitable numbers and/or types of pieces as long as the first fluid meniscus and the second fluid meniscus as described herein may be generated. In one embodiment, the facilities plate 454 and the body 458 may be bolted together or in another embodiment, the plate 454 and the body 458 may be attached by an adhesive. The facilities plate 454 and the body 458 may be made from the same material or different materials depending on the applications and operations desired by a user.

The proximity head 106-2 may include a processing surface 458 which includes conduits where fluid(s) may be applied to surface of the wafer and the fluid(s) maybe removed from a surface of the wafer. The processing surface 458 may, in one embodiment, be elevated above a surface 453 as shown by an elevated region 452. It should be appreciated that the processing surface 458 does not have to be elevated and that the surface 458 may be substantially planar with the surface 453 of the proximity head 106-2 that faces the surface of the wafer being processed.

Figure 6B:
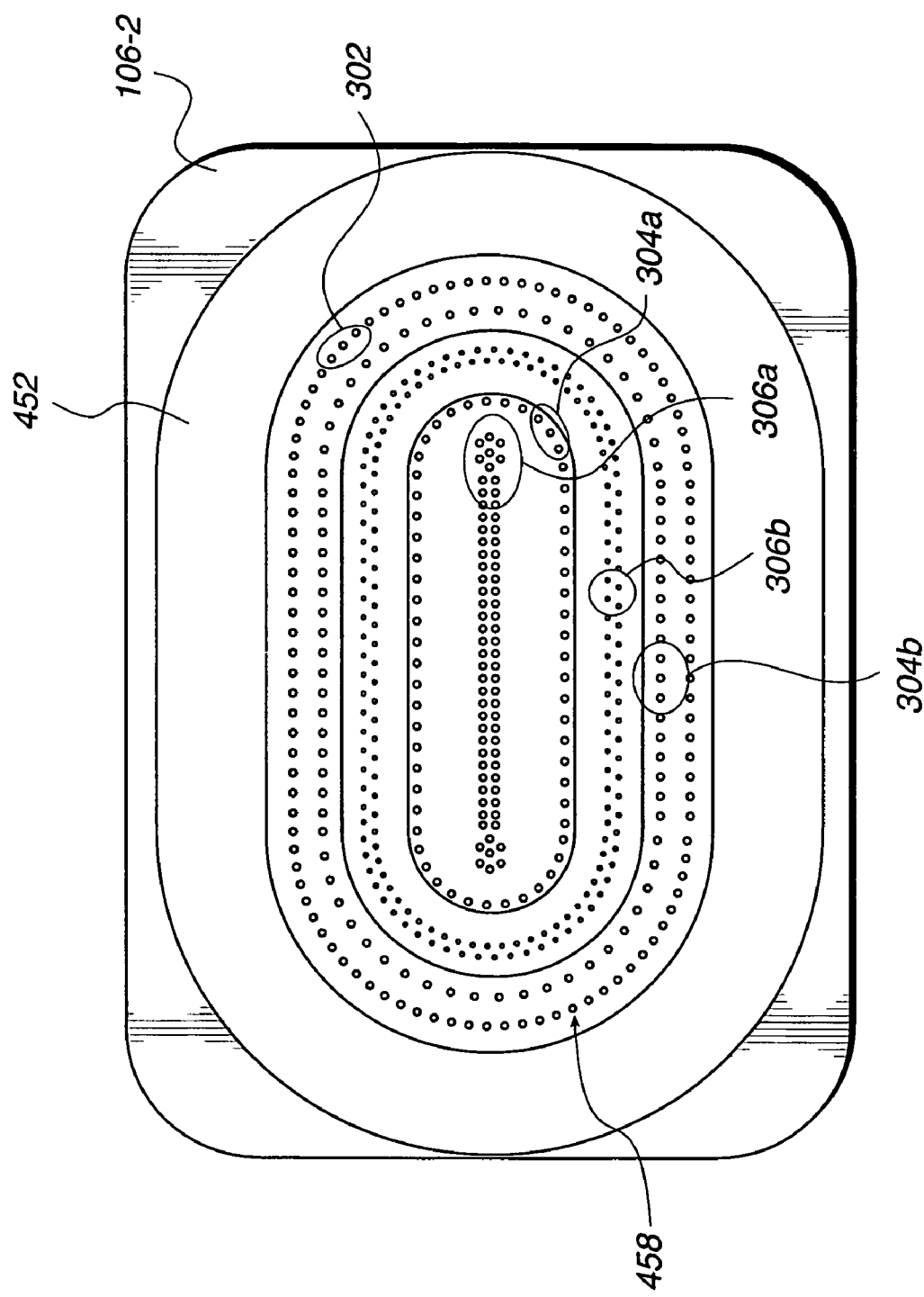
FIG. 6B illustrates the processing surface of the proximity head in accordance with one embodiment of the present invention.

FIG. 6B illustrates the processing surface 458 of the proximity head 106-2 in accordance with one embodiment of the present invention. In one embodiment, the processing surface 458 is a region of the proximity head 106-2 which generates the fluid menisci. The processing surface 458 may include any suitable number and type of conduits so the first fluid meniscus and the second fluid meniscus may be generated. In one embodiment, the processing surface 458 includes fluid inlets 306*a*, fluid outlets 304*a*, fluid inlets 306*b*, fluid outlets 304*b*, and fluid inlets 302.

The fluid inlets 306*a* may apply a first fluid to the surface of the wafer, and the fluid inlets 306*b* may apply a second fluid to the surface of the wafer. In addition, the fluid outlets 304*a* may remove the first fluid and a portion of a second fluid from the surface of the wafer by the application of siphoning and/or vacuum, and the fluid outlets 304*b* may remove a portion of the second fluid from the surface of the wafer by the application of vacuum, and the fluid inlets 302 may apply a fluid that can decrease the surface tension of the second fluid. The first fluid and/or the second fluid may be any suitable fluid that can facilitate any one of a lithography operation, an etching operation, a plating operation, a cleaning operation, a rinsing operation, and a drying operation.

Figure 6C:
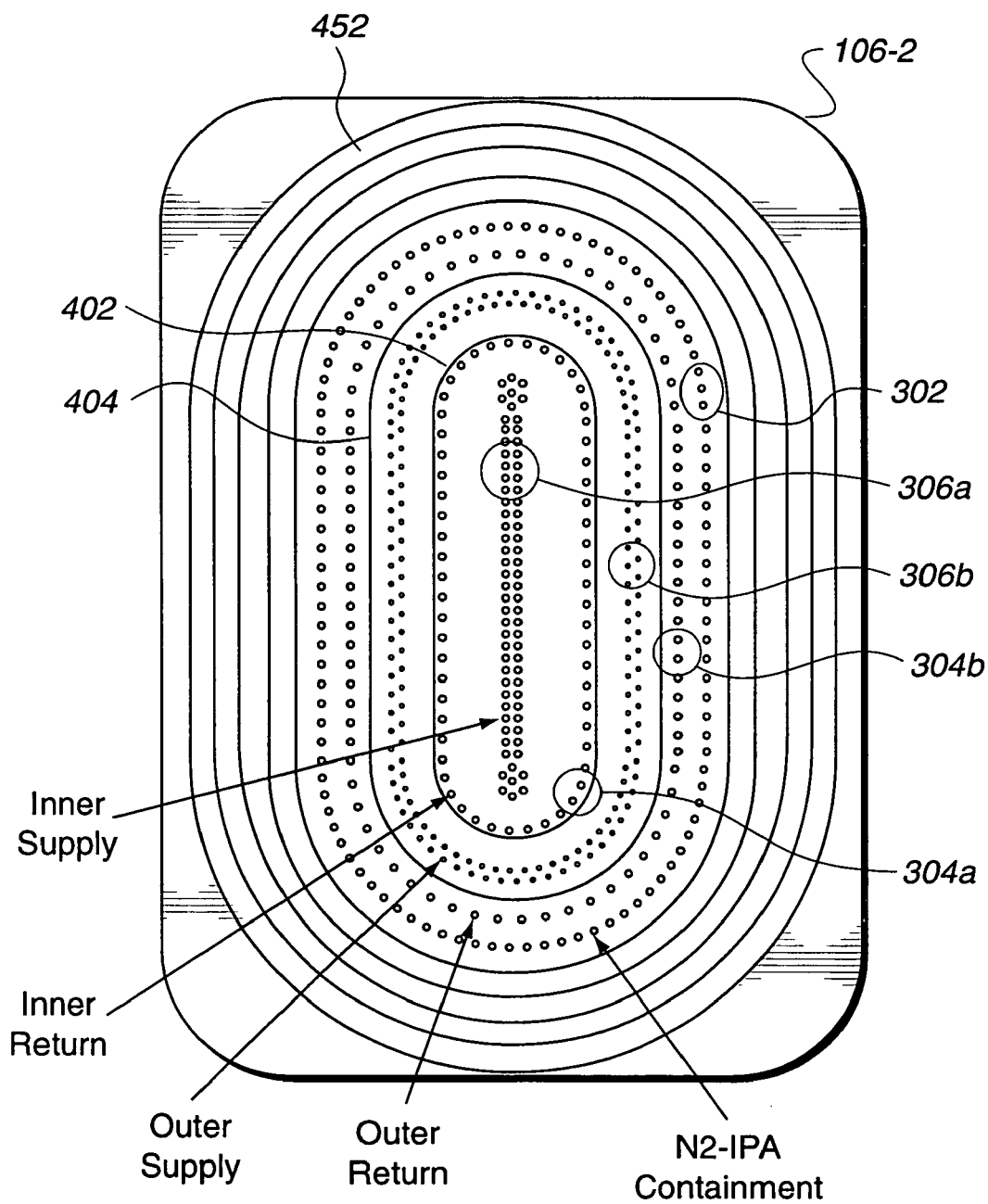
FIG. 6C shows a closer view of the processing surface of the multi-meniscus proximity head in accordance with one embodiment of the present invention.

FIG. 6C shows a closer view of the processing surface 458 of the multi-meniscus proximity head 106-2 in accordance with one embodiment of the present invention. In one embodiment, the processing surface 458 includes a first fluid meniscus region 402 which includes the fluid inlets 306*a* and fluid outlets 304*a*. The processing surface 458 also includes a second fluid meniscus region 404 includes the fluid inlets 306*b* and the fluid outlets 304*b* and the fluid inlets 302. Therefore, the first fluid meniscus region 402 can generate the first fluid meniscus and the second fluid meniscus region 404 can generate the second fluid meniscus.

Figure 6D:
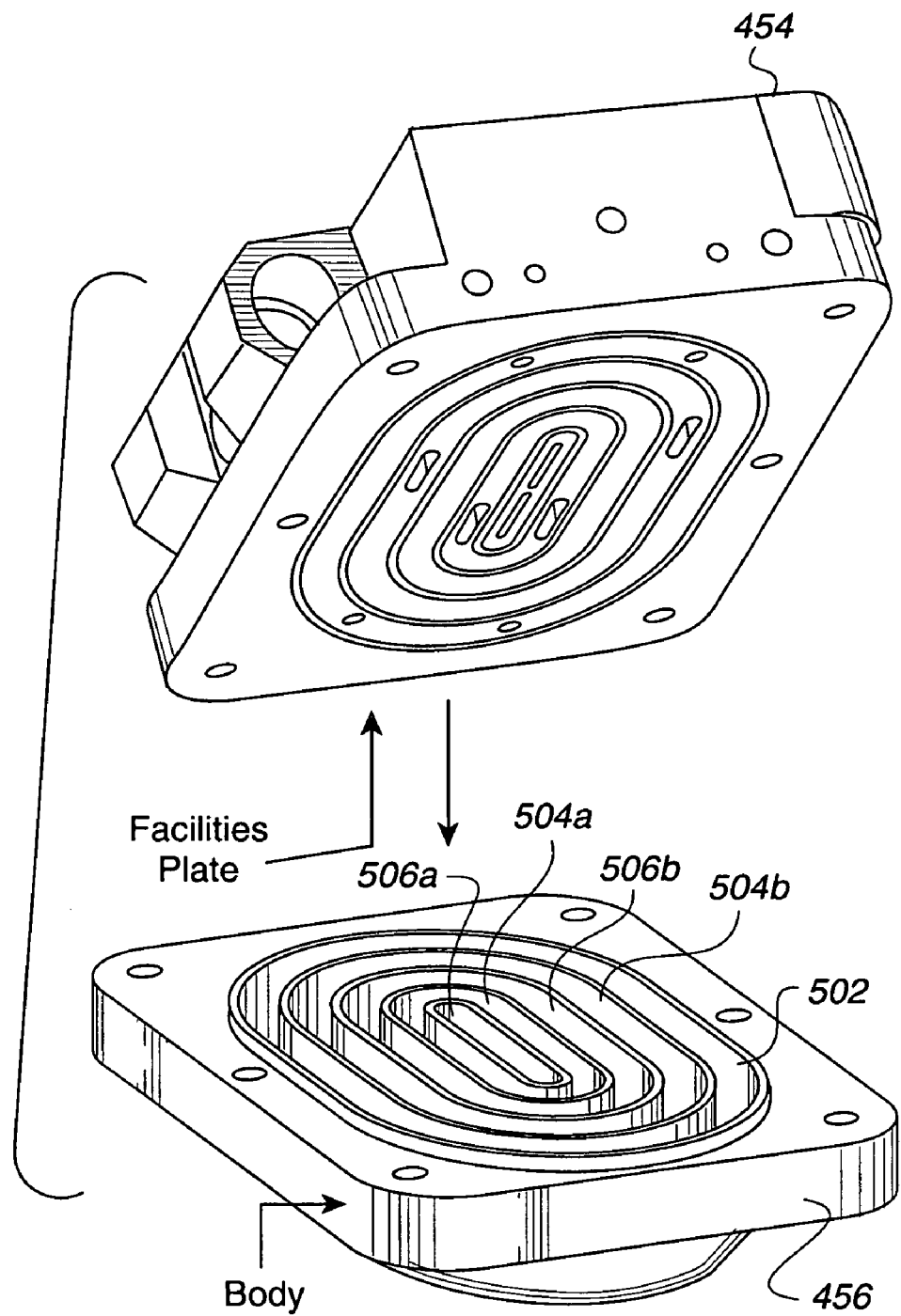
FIG. 6D shows the facilities plate attaching to the body to form the multi-menisci proximity head in accordance with one embodiment of the present invention.

FIG. 6D shows the facilities plate 454 attaching to the body 456 to form the multi-menisci proximity head 106-2 in accordance with one embodiment of the present invention. Channels corresponding to the fluid inlets 306*a*, 306*b*, and 302 supply fluid from the facilities plate 454 into the body 456 of the multi-menisci proximity head 106-2, and channels corresponding to the fluid outlets 304*a* and 304*b* remove fluid from the body 456 to the facilities 454. In one embodiment channels 506*a*, 504*a*, 506*b*, 504*b*, and 502 correspond to the fluid inlets 306*a*, fluid outlets 304*a*, fluid inlets 306*b*, fluid outlets 304*b*, and fluid inlets 302.

Figure 6E:
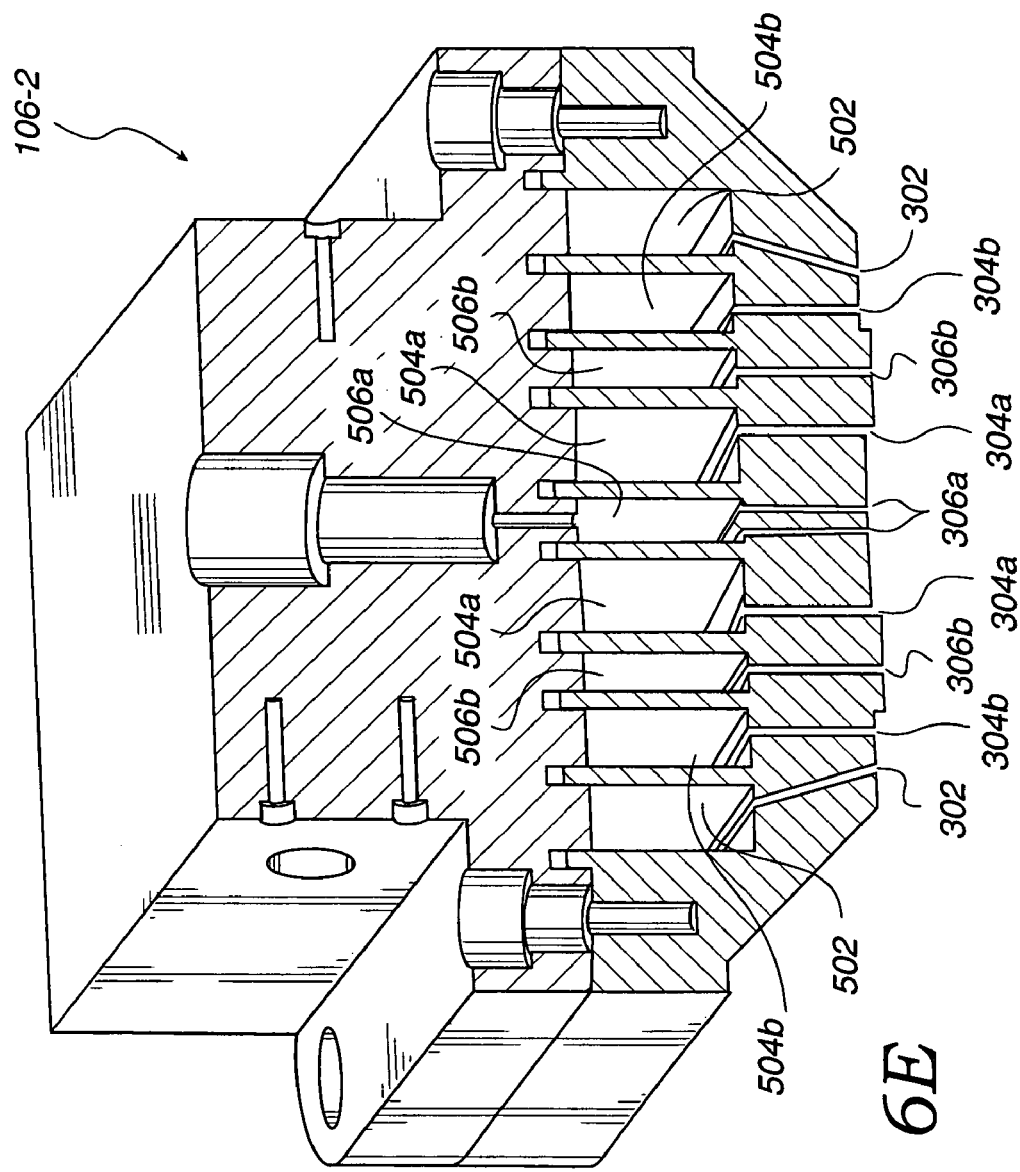
FIG. 6E illustrates a cross section view of the proximity head in accordance with one embodiment of the present invention.

FIG. 6E illustrates a cross section view of the proximity head 106-2 in accordance with one embodiment of the present invention. As described in reference to FIG. 6D, channels 506*a*, 506*b*, and 502 may supply a first fluid, a second fluid, and a third fluid to fluid inlets 306*a*, 306*b*, and 302 respectively. In addition, a channel 504*a* may remove a combination of the first fluid and the second fluid from the fluid outlets 304*a* through use of siphoning and/or vacuum, and channel 504*b* may remove combination of the second fluid and the third fluid from the outlets 304*b*. In one embodiment, the first fluid is a first processing fluid that can conduct any suitable operation on a wafer surface such as, for example, etching, lithography, cleaning, rinsing, and drying. The second fluid is a second processing fluid that may or may not be the same as the first fluid. As with the first fluid, the second fluid may be any suitable type of processing fluid such as, for example, a fluid that can facilitate etching, lithography, cleaning, rinsing, and drying.

Figure 7:
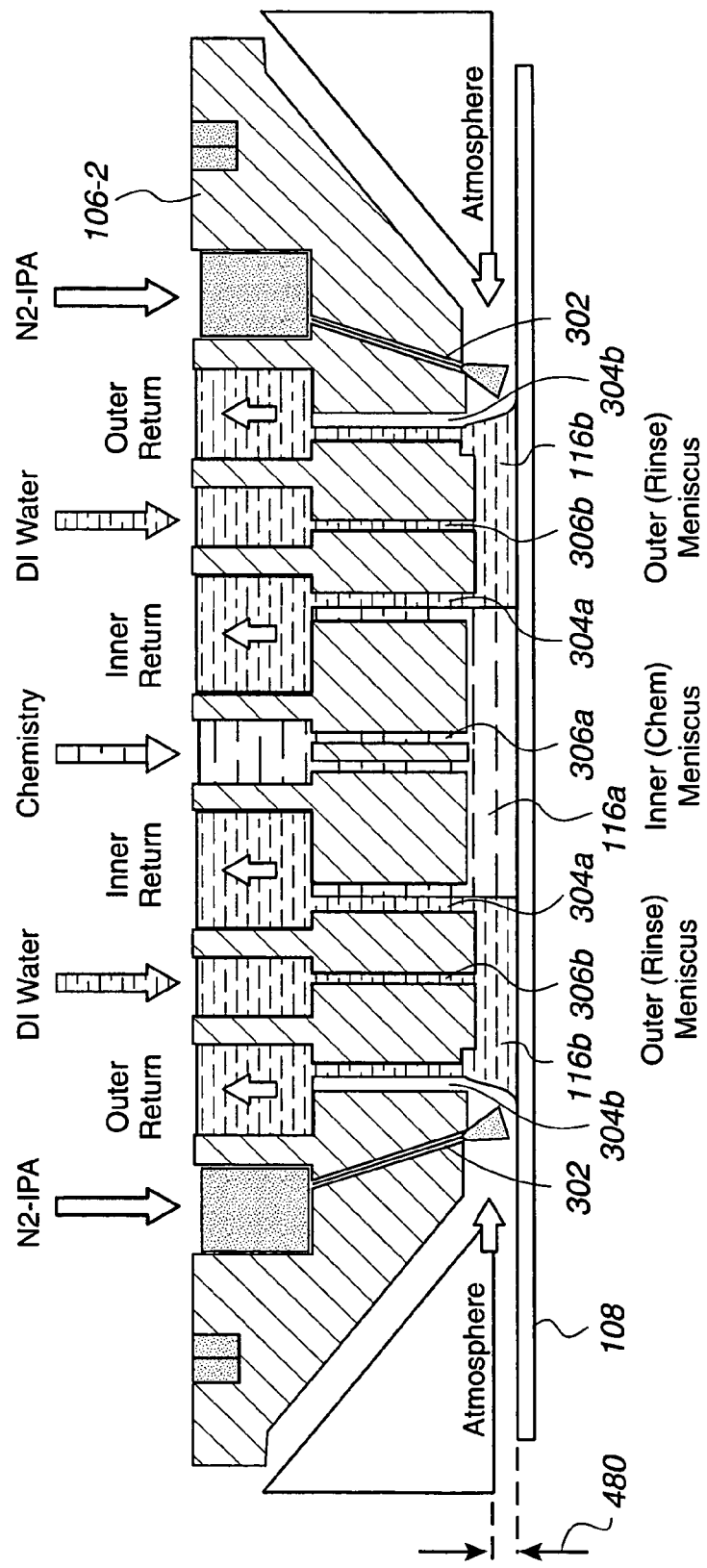
FIG. 7 illustrates a cross-sectional view of the multi-menisci proximity head in exemplary wafer processing operations in accordance with one embodiment of the present invention.

FIG. 7 illustrates a cross-sectional view of the multi-menisci proximity head in exemplary wafer processing operations in accordance with one embodiment of the present invention. Although FIG. 7 shows a top surface of the wafer 108 being processed, it should be appreciated by those skilled in the art that both a top surface and a bottom surface of the wafer 108 may be concurrently processed by any of the proximity heads described herein on the top surface of the wafer 108 and by any of the proximity heads described herein on the bottom surface of the wafer 108. In one embodiment, a first wafer processing chemistry is applied to the wafer 108 through fluid inlet 306a. After the first wafer processing chemistry has processed the wafer surface, the first wafer processing chemistry is removed from the wafer surface through the fluid outlet 304a. The first wafer processing fluid may form a first fluid meniscus 116a between the multi-menisci proximity head 106-2 and the wafer 108. In one embodiment, a second processing fluid such as, for example, deionized water (DIW) is applied to the wafer surface through the fluid inlets 306b.

As discussed above, the second processing fluid may be any suitable fluid that can accomplish the desired operation on the wafer surface. After the DIW has processed the wafer surface, the DIW is removed from the wafer surface through both the source outlets 304a and 304b. The DIW between the multi-menisci proximity head 106-2 and the wafer surface may form a second fluid meniscus 116b.

In one embodiment, a surface tension reducing fluid such as, for example, isopropyl alcohol vapor in nitrogen gas may optionally be applied from the source inlet 302 to the wafer surface to keep the liquid/gas border of the second fluid meniscus 116b stable. In one embodiment, the second fluid meniscus 116b can substantially surround the first fluid meniscus 116a. In this way, after the first fluid meniscus 116a has processed the wafer surface, the second fluid meniscus 116b can nearly immediately begin operating on a portion of the wafer surface already processed by the first fluid meniscus 116a. Therefore, in one embodiment, the second fluid meniscus 116b forms a concentric ring around the first fluid meniscus 116a. It should be appreciated that the first fluid meniscus 116a may be any suitable geometric shape such as, a circle, ellipse, square, rectangle, triangular, quadrilateral, etc. The second fluid meniscus 116b can be configured to at least partially surround whatever shape the first fluid meniscus 116a may be. It should be appreciated that, as discussed above, the first fluid meniscus 116a and/or the second fluid meniscus 116b may utilize any suitable fluid(s) depending on the wafer processing operation desired.

It should be appreciated that to generate a stable fluid meniscus, an amount of the first fluid inputted into the first fluid meniscus through the source inlets 306a should be substantially equal to the amount of the first fluid removed through the source outlets 304a. The amount of the second fluid inputted into the second fluid meniscus through the source inlets 306b should be substantially equal to the amount of the second fluid removed through the source outlets 304a and 304b. In one embodiment, the flow rates of the fluids are determined by a distance 480 the proximity head 106-2 is off of the wafer 108. It should be appreciated that the distance 480 may be any suitable distance as long as the menisci can be maintained and moved in a stable manner. In one embodiment, the distance 480 may be between 50 microns and 5 mm, and in another embodiment 0.5 mm to 2.5 mm. Preferably, the distance 480 is between about 1 mm and 1.5 mm. In one embodiment, the distance 480 is about 1.3 mm.

The flow rates of the fluids as shown in FIG. 7 may be any suitable flow rate that can generate the first fluid meniscus and the second fluid meniscus that substantially surrounds the first meniscus. Depending on the distinction desired between the first fluid meniscus and the second fluid meniscus, the flow rates may differ. In one embodiment, source inlets 306a may apply the first fluid at a flow rate of about 600 cc/min, source inlets 306b may apply the second fluid at a flow rate of about 900 cc/min, a source outlets 304a may remove the first fluid and the second fluid at a flow rate of about 1200 cc/min, and the source outlets 304b may remove the second fluid and atmosphere (which may include some IPA vapor in $N_2$ if such a surface tension reducing fluid is being applied to the wafer surface) at a flow rate of about 300 cc/min. In one embodiment, the flow rate of fluids through the source outlets 304 may equal 2 times the flow rate of fluid through the source inlets 306a. The flow rate of fluid through the source inlets 306b may be equal to the flow rate through the source inlets 306a plus 300 cc/min. It should be appreciated by those skilled in the art that specific flow rate relationships of the source inlets 306a, 306b and source outlets 304a, 304b may change depending on the configuration of the process area and/or the configuration of the proximity heads described herein.

Moreover, by use of siphoning through the source outlets 304a, the optimal flow rate is automatically generated thereby creating a self regulating meniscus where the flow rate of fluid from the meniscus to the source outlets 304 is automatically adjusted depending on the flow rates through the source inlets 306a and 306b. As long as the fluid being removed by the source outlets 304a is substantially single phase then the siphon can keep operating to self regulate the shape and size of the fluid meniscus.

Figure 8:
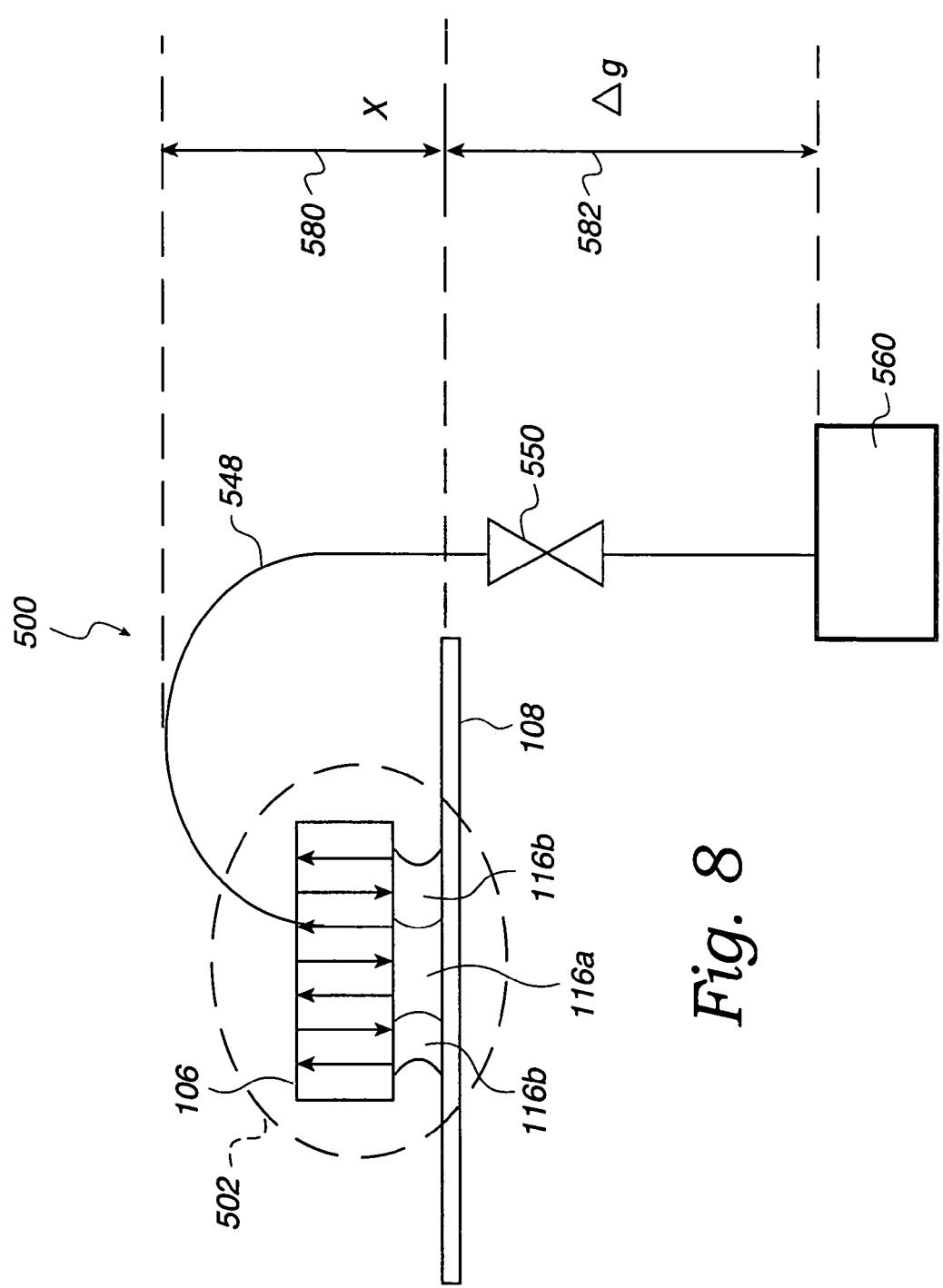
FIG. 8 illustrates a siphoning system in accordance with one embodiment of the present invention.

FIG. 8 illustrates a siphoning system 500 in accordance with one embodiment of the present invention. In one embodiment, siphoning may be used to control fluid removal through the source outlet(s) (e.g., inner return flow). In one embodiment, when siphoning is utilized, vacuum is not utilized therefore, the flow of fluid from the fluid meniscus is made independent from fluctuations in the clean dry air generating the vacuum in a vacuum tank. This generates enhanced stability of the inner return flow which results in greater stability of the overall meniscus. In addition, the meniscus may become self regulating and therefore be more robust.

In one embodiment, the siphoning system 500 includes at least one siphon tube 548 coupled to the proximity head 106. The one or more siphon tubes 548 may be coupled to the proximity head 106 to remove fluid from fluid meniscus(es) generated by the proximity head 106. In one embodiment, the siphon tubes 548 are connected at the other end to a receiving tank 560 where fluids removed from the proximity head 106 may be outputted from the siphon tubes 548. In one embodiment, the receiving tank is at a lower elevation than the proximity head 106 which promotes the siphoning action. In one embodiment, the siphoning system 500 is structured so the gravitational force corresponding to the vertical distance 580 is less than the gravitational force corresponding to the vertical distance 582. The maximum siphon flow can be regulated by conductance of plumbing from the proximity head 106 to the receiving tank 560. Therefore, specific siphon flow rates can be achieved via the use of flow restrictor 550 in the line. Fixed restriction of the flow restrictor 550 can therefore result in set and forget siphon flow rates. In addition, variable restrictions of the flow restrictor 550 may be used for tunable control of the siphon flow. In one embodiment, the flow restrictor 550 may be any suitable device such as, for example, a valve that can control fluid flow.

In one embodiment, a siphon flow can be induced via tank vacuum to charge a dry line. In one embodiment, the siphon tube 548 may be charged by applying vacuum and thereby filling the siphon tube 548 with liquid from a fluid meniscus generated by the proximity head 106. Once the siphon tube 548 is filled with liquid, the vacuum may pull the fluid in the siphon tube 548 to the receiving tank 560. Once the flow has started the tank vacuum in the receiving tank 560 may be eliminated and the siphon action facilitates the fluid flow through the siphon tube 548.

In another embodiment, the restrictor 550 may be a shut-off valve could be used to start and stop the flow without assistance of tank vacuum. If the siphon tube 548 is charged (e.g., filled with liquid), opening the valve starts siphon flow. If the siphon tube 548 is dry, then it could be charged first with fluid and then the siphon flow would begin as soon as the valve is opened. Therefore, in one embodiment, siphon flow can be used for all single-phase liquid lines in the system. In addition, siphon flow is operable with air bubbles as long as the line is substantially filled with liquid.

It should be appreciated that the siphoning system 500 may be utilized with any suitable proximity head 106 that has a fluid return system that removes a single phase fluid such as liquids.

Figure 9:
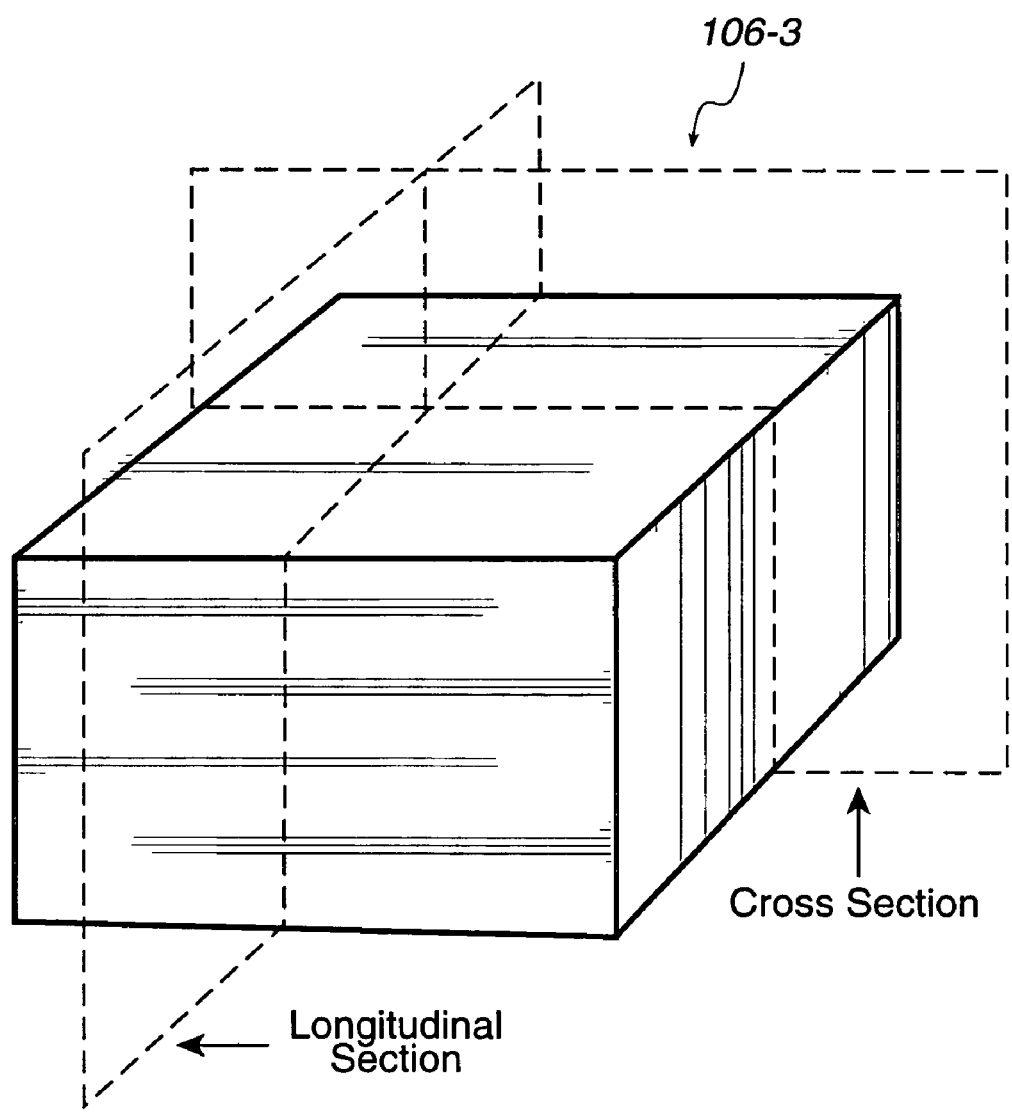
FIG. 9 illustrates a proximity head with an active cavity in accordance with one embodiment of the present invention.

FIG. 9 illustrates a proximity head 106-3 with an active cavity in accordance with one embodiment of the present invention. In one embodiment, the proximity head 106-3 has a cross section that is described in further detail in reference to FIG. 10 and a longitudinal section that is described in further detail in reference to FIG. 11. An exemplary processing surface of the proximity head 106-3 is discussed in further detail in reference to FIG. 15A.

Figure 10:
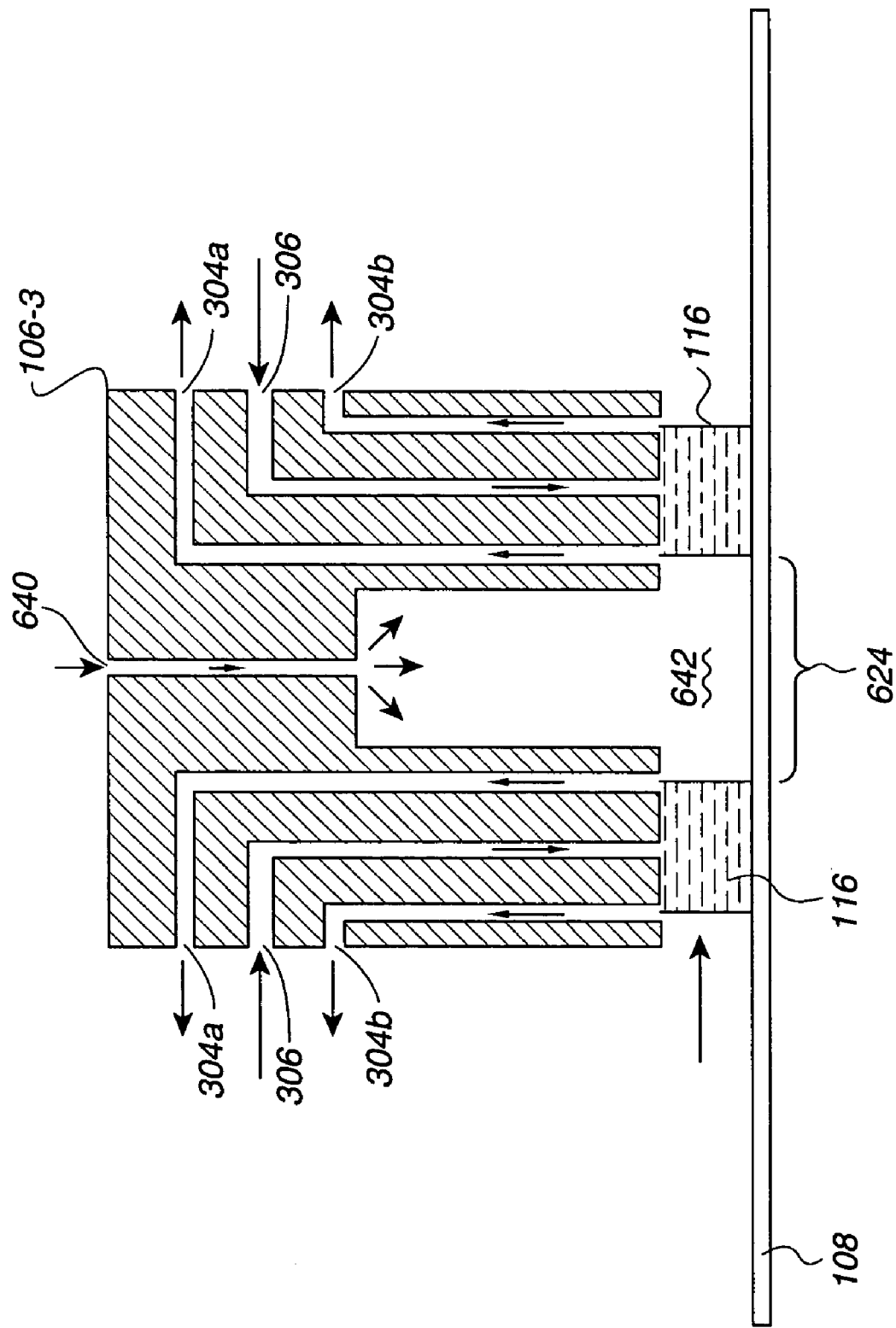
FIG. 10 shows a cross section of the proximity head in operation in accordance with one embodiment of the present invention.

FIG. 10 shows a cross section of the proximity head 106-3 in operation in accordance with one embodiment of the present invention. In one embodiment, the proximity head 106-3 includes a source inlet 640 into a cavity 642. The cavity 642 may be any suitable shape and may take up any suitable volume within the proximity head 106-3 as long as the active agent may be inputted into the cavity 642 and the active agent may be applied to the wafer surface through an opening (e.g., active cavity window 624). In one embodiment, the opening to the cavity 642 is substantially surrounded by the fluid meniscus 116 generated by the application of fluid to the wafer surface by the source inlets 306 and by the removal of the fluid from the fluid meniscus 116 by the source outlets 304a and 304b. The cavity 642 may be used to deliver active agents to the wafer surface via the active cavity window 624. It should be appreciated that the active cavity window 624 may be any suitable size and/or shape depending on the size and shape of the region of the wafer surface desired to be processed. In one embodiment, the active cavity window 624 defines the opening to the cavity 642. The wafer surface within the active cavity window 624 that is processed by the active agents is known as an active region. The active agent may be any suitable liquid, gas, vapor, or other form of chemistry (e.g., foam) that can process the wafer. In one embodiment, the active agent may include substances such as, for example, ozone, chelating agents (e.g., EDTA, etc.), cleaning chemistries (e.g., SC1, SC2, etc.), semi-aqueous solvents (e.g., ATMI ST-255 and ATMI PT-15 (made by ATMI of Danbury, Conn.), EKC5800™ (made by EKC Technology in Danville, CA, etc.), HF, etc.). The active agents can be dispensed via the source inlet 640 which in one embodiment may include nozzles (e.g., flat fan, cone spray, mist/fogger). It should be appreciated that the source inlet 640 may be any suitable type of opening that can transport the active agent into the cavity 642.

In operation, the active agents may be rinsed or otherwise removed by the meniscus 116 that surrounds the active cavity window 624. In this manner, the wafer 108 may be dry in and dry out meaning that the wafer may, in one embodiment, be dry before wafer processing and substantially dry after wafer processing even though the wafer surface has been treated by active agents in the active cavity window 624. Therefore, the active agents can be confined to the cavity within the proximity head 106-3.

In one embodiment, ozone (or other oxidizing gas) may be introduced into the cavity 642 and the wafer surface in the active cavity window 624 is wetted by the meniscus 116 which may be a heated DIW rinse meniscus. The ozone in this case may react with and remove organic material from the wafer surface through the wafer boundary layer. This may be used in operation such as, for example, strip photoresist operations.

It should be appreciated that the conduit (i.e., outlets and inlets) pattern and proximity head structure utilized in FIG. 10 as well as the other conduit patterns and proximity head structures discussed herein are only exemplary in nature and that the proximity head discussed herein encompasses any suitable proximity head structure that may be utilized that can generate a fluid meniscus substantially around a region of the substrate surface where active agents can conduct substrate processing.

Figure 11:
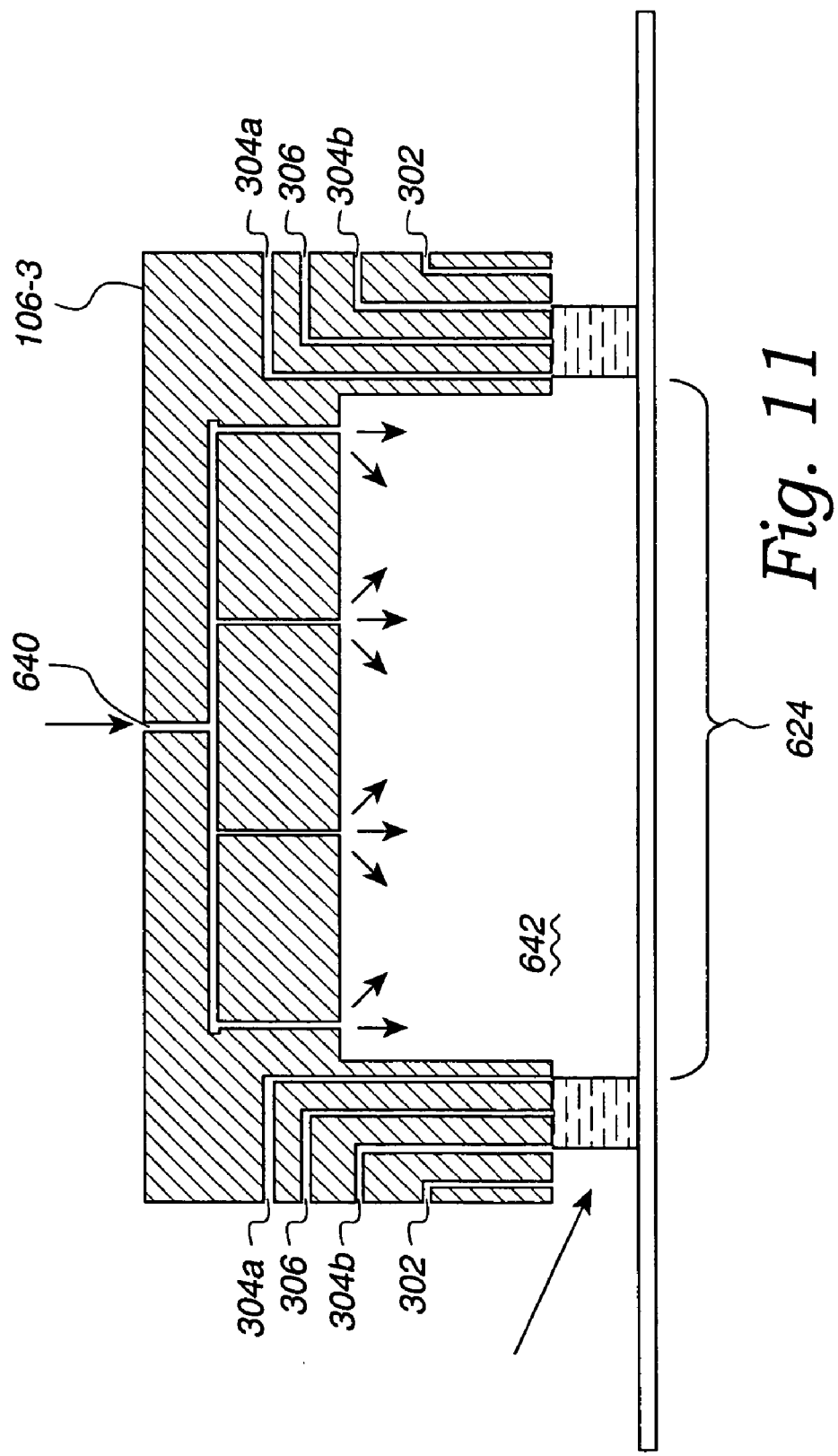
FIG. 11 shows a longitudinal view of the proximity head in accordance with one embodiment of the present invention.

FIG. 11 shows a longitudinal view of the proximity head 106-3 in accordance with one embodiment of the present invention. As discussed above in reference to FIG. 10, the proximity head 106-3 include source inlets 640 into the cavity 642. In the embodiment shown in FIG. 11, four source inlets 640 are defined within the longitudinal section of the proximity head 106-3. It should be appreciated that depending on the wafer processing operation desired and the amount of active agents desired to be inputted into the cavity 642, any suitable number of source inlets 640 may be included in the proximity head 106-3 such as, for example, 1, 2, 3, 4, 5, 6, 7, 8, 9, 10, etc. Also, the proximity head in the longitudinal view includes source inlets 306 and source outlets 304a and 304 as well as source inlets 302 for generating the fluid meniscus 116. In one embodiment, the source inlets 306 may apply a processing fluid (e.g., rinsing fluid) to the wafer surface. The processing fluid may be removed from the wafer surface by the source outlet 304a and 304b. It should be appreciated that source inlet 302 is optionally included in the proximity head 106-3 and depending on the proximity head 106-3 configuration, a stable fluid meniscus may be generated without usage of the source inlets 302. In one embodiment, when the source inlet 302 is utilized, a surface tension reducing fluid may be applied to the wafer surface and the outer border of the fluid meniscus 116. Consequently, the fluid meniscus 116 generated surrounds the active cavity window 624.

FIG. 12 shows a cross sectional view of a proximity head 106-4 with the active cavity window 624 in accordance with one embodiment of the present invention. It should be appreciated that the cross sectional view shown in FIG. 12 is another embodiment of the cross sectional view discussed above in reference to FIG. 10. In one embodiment, the cross sectional view of the proximity head 106-4 includes a source inlet 640 that can input an active agent into the cavity 642. The active agent can then process an active region of the substrate surface that is defined by the active cavity window 624. In addition, the cross sectional view of the proximity head 106-4 also includes source inlets 306 and source outlets 304a, 304b, and 304c. In one embodiment, the proximity head 106-4 can apply a fluid through the source inlets 306 to the surface of the wafer to a region substantially surrounding the active region. The source outlets 304a, 304b, and 304c can remove the fluid from the surface of the wafer substantially surrounding the active region. This application and removal of fluid may generate the fluid meniscus that can substantially surround the active region. In such an embodiment, an active agent can be applied to process the active region of the wafer surface and afterwards with either one of wafer or proximity head movement, the fluid meniscus 116 may further process (e.g., clean, rinse, etch, etc.) the wafer surface in the active region.

In the embodiment shown in FIG. 12, the source outlet 304a may utilize vacuum to remove fluids from the wafer surface. In one embodiment, the source outlet 304a may remove the fluid applied by the source inlets 304a as well as the fluids and/or materials remaining from the active agent processing of the active region of the wafer surface. The source outlet 304b in this embodiment may be a single phase meniscus removal conduit. In this embodiment, the source outlet 304b may use vacuum and/or siphoning to remove the fluid making up the fluid meniscus 116. The source outlet 304c in this embodiment may utilize vacuum to remove the fluid from an outer region of the fluid meniscus 116 to define the outside border of the fluid meniscus 116.

FIG. 13 illustrates a cross sectional view of a proximity head 106-5 which includes multiple cavities with multiple menisci in one embodiment of the present invention. The cross section view of the proximity head 106-5 is another embodiment of the cross section view as discussed in reference to FIG. 10. In addition, it should be appreciated that the source inlets and outlets such as, for example, source inlet 306b and source outlets 304c and 304d of the cross sectional view may extend into a z-axis. It should be appreciated that any suitable plumbing of the source inlets and outlets may be utilized that can generate the fluid menisci consistent with the methodologies and descriptions herein. In one embodiment, the proximity head 106-5 includes multiple cavities 642a and 642b. It should be appreciated that the proximity heads described herein may contain any suitable number of cavities such as, for example, 1, 2, 3, 4, 5, 6, 7, 8, 9, 10, etc. depending on the wafer processing operation desired. It should be appreciated that the cavities 642a and 642b may be any suitable shape and may be located in any suitable place as long as the openings to the cavities may be substantially surrounded by fluid menisci.

In one embodiment, the proximity head 106-5 can include source inlets 304b to apply fluid to a wafer surface and source outlets 304c and 304d to remove fluid from the wafer surface to generate a fluid meniscus 116c. The proximity head 106-5 may also include source inlets 306a and source outlets 304a and 304b may generate the fluid meniscus 116b substantially surrounding the active region defined by the active cavity window 624a. The proximity head 106-5 may further include source inlets 306c and source outlets 304e and 304f to generate the fluid meniscus 116b which can substantially surround the active cavity window 624. In one embodiment, the proximity head 106-5 may apply an active agent into the cavities 642a and 642b from the source inlets 640a and 640b respectively. An exemplary processing surface of the proximity head 106-5 is discussed in further detail in reference to FIG. 15B.

FIGS. 14A through 14E illustrate exemplary proximity head structures. It should be appreciated that the active cavity windows in all of the embodiments are substantially surrounded by conduits that may generate a fluid meniscus substantially surrounding the active cavity windows.

Figure 14A:
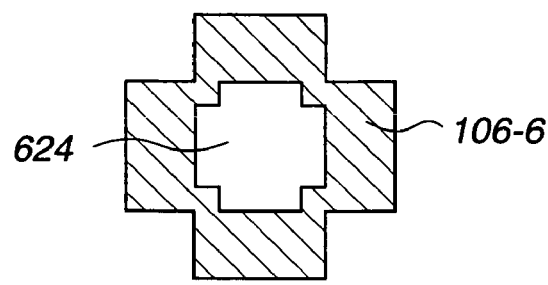
FIG. 14A shows a cross shaped proximity head in accordance with one embodiment of the present invention.

FIG. 14A shows a cross shaped proximity head 106-6 in accordance with one embodiment of the present invention. In one embodiment, the active cavity window 624 is in a shape of a cross. In operation, the proximity head 106-6 may be configured to generate the fluid meniscus 116 around the active cavity window 624.

Figure 14B:
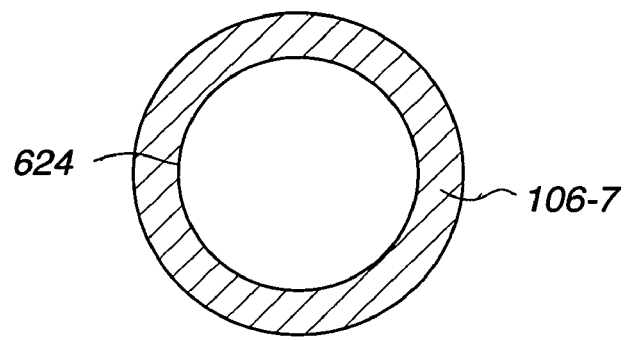
FIG. 14B illustrates a circular shaped proximity head in accordance with one embodiment of the present invention.

FIG. 14B illustrates a circular shaped proximity head 106-7 in accordance with one embodiment of the present invention. In one embodiment, the active cavity window 624 is a circular shape. In operation, the proximity head 106-7 may be configured to generate the fluid meniscus 116 around the active cavity window 624.

Figure 14C:
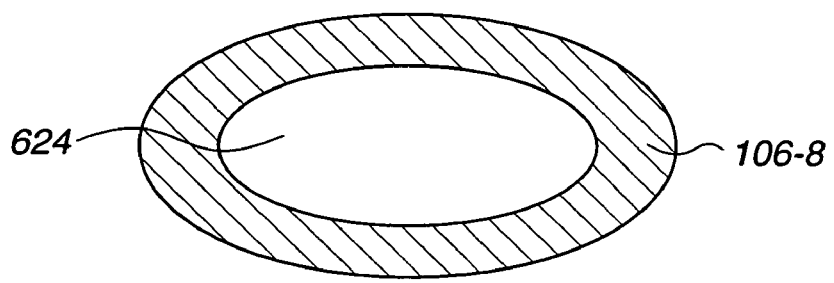
FIG. 14C shows an oval shaped proximity head in accordance with one embodiment of the present invention.

FIG. 14C shows an oval shaped proximity head 106-8 in accordance with one embodiment of the present invention. In one embodiment, the active cavity window 624 is an oval shape. In operation, the proximity head 106-8 may be configured to generate the fluid meniscus 116 around the active cavity window 624.

Figure 14D:
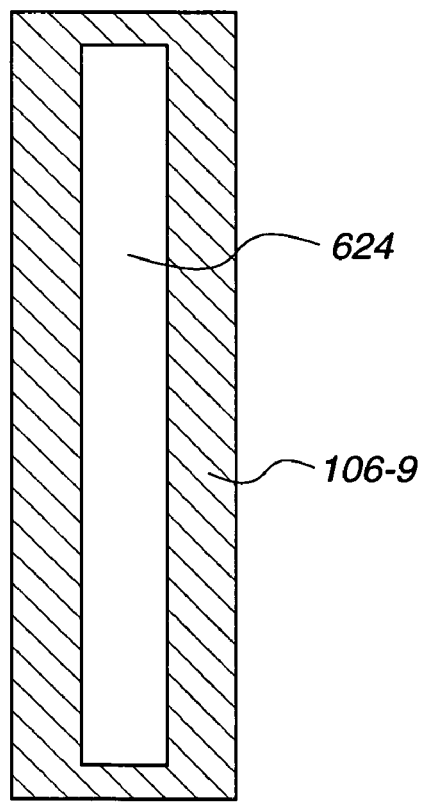
FIG. 14D illustrates a strip shaped proximity head in accordance with one embodiment of the present invention.

FIG. 14D illustrates a strip shaped proximity head 106-9 in accordance with one embodiment of the present invention. In one embodiment, the active cavity window 624 is a strip shape. In operation, the proximity head 106-9 may be configured to generate the fluid meniscus 116 around the active cavity window 624.

Figure 14E:
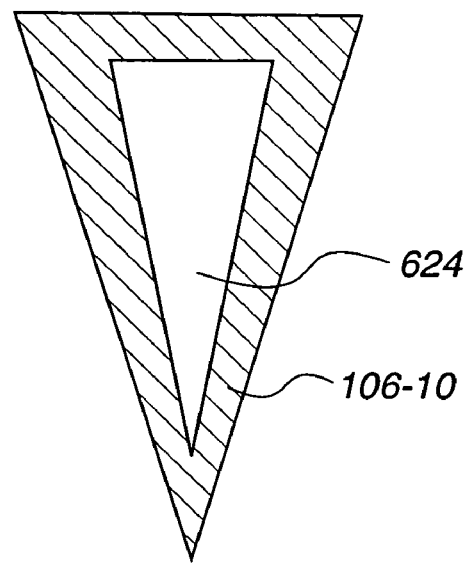
FIG. 14E shows a wedge shaped proximity head in accordance with one embodiment of the present invention.

FIG. 14E shows a wedge shaped proximity head 106-10 in accordance with one embodiment of the present invention. In one embodiment, the active cavity window 624 is a wedge shape. In operation, the proximity head 106-10 may be configured to generate the fluid meniscus 116 around the active cavity window 624.

Figure 15A:
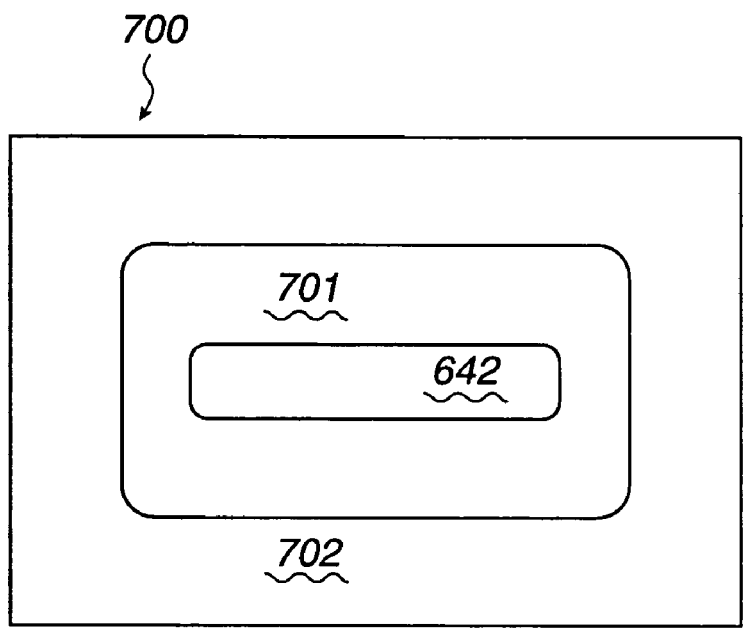
FIG. 15A shows an exemplary view of a processing surface of the proximity head in accordance with one embodiment of the present invention.

FIG. 15A shows an exemplary view of a processing surface 700 of the proximity head 106-3 in accordance with one embodiment of the present invention. In one embodiment, the processing surface 700 includes the cavity 642 as discussed in further detail in reference to FIGS. 10 and 11. The processing surface 700 may also include a region 701 substantially surrounding the openings to the cavity 642 which may include a plurality of conduits that can generate the fluid meniscus 116 such as, for example, source inlets 306 and source outlets 304a and 304b as discussed in further detail in reference to FIGS. 10 and 11. In one embodiment, the plurality of conduits may surround the cavity 642.

Figure 15B:
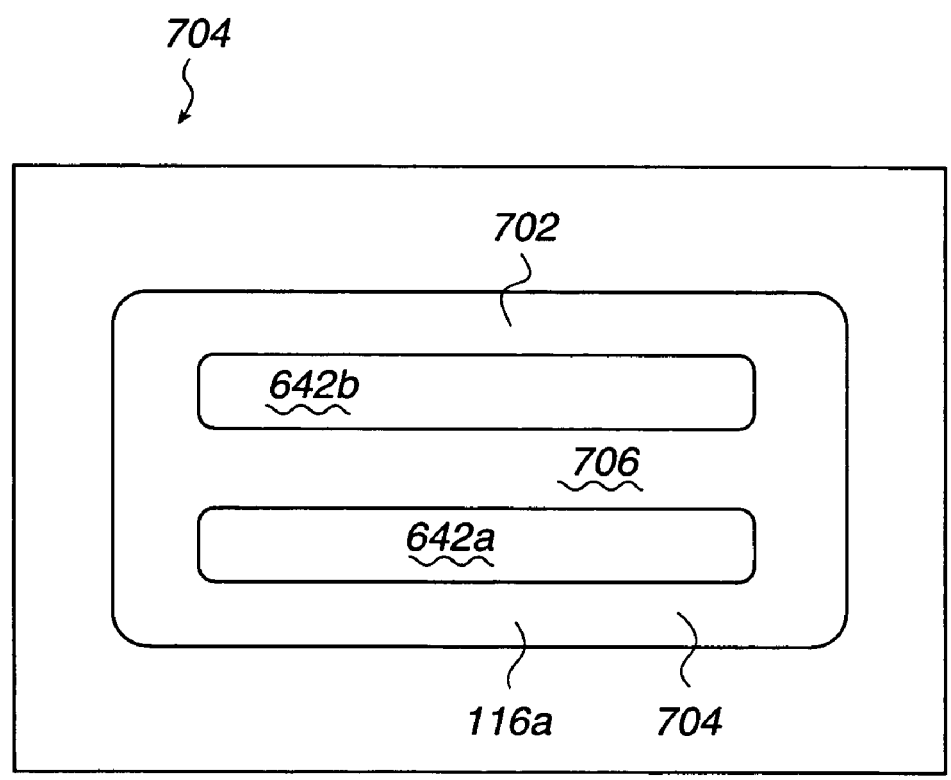
FIG. 15B illustrates an exemplary view of a processing surface of the proximity head in accordance with one embodiment of the present invention.

FIG. 15B illustrates an exemplary view of a processing surface 704 of the proximity head 106-5 in accordance with one embodiment of the present invention. In one embodiment, the processing surface 704 may include the cavities 642a and 642b as discussed in further detail in reference to FIG. 13. In addition, the proximity head 106-5 may also include regions 702, 706, and 704 which may substantially surround the opening to the cavities. The regions 702, 706, and 704 include a plurality of conduits that can generate the fluid menisci 116a, 116c, and 116b. In one embodiment, the plurality of conduits may include source inlets 306a, 306b, and 306c as well as source outlets 304a, 304b, 304c, 304d, 304e, and 304f as discussed in further detail in reference to FIG. 13.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for processing a substrate, comprising:
   a proximity head configured to be proximate to a surface of the substrate when in operation;
   an opening on a surface of the proximity head to a cavity defined in the proximity head, the cavity being configured to deliver an active agent to the surface of the substrate through the opening; and
   a plurality of conduits on the surface of the proximity head configured to generate a fluid meniscus on the surface of the substrate surrounding the opening.

2. An apparatus for processing a substrate as recited in claim 1, wherein the fluid meniscus processes the surface of the substrate.

3. An apparatus for processing a substrate as recited in claim 1, wherein the plurality of conduits includes a plurality of inlets and a plurality of outlets.

4. An apparatus for processing a substrate as recited in claim 1, wherein the plurality of conduits includes an inlet to apply a fluid to the surface of the substrate and an outlet to remove the fluid from the surface of the substrate.

5. An apparatus for processing a substrate as recited in claim 4, wherein the fluid is one of a lithographic fluid, an etching fluid, a plating fluid, a cleaning fluid, or a rinsing fluid.

6. An apparatus for processing a substrate as recited in claim 4, wherein the plurality of conduits further include an additional inlet to apply a surface tension reducing fluid to the surface of the substrate.

7. An apparatus for processing a substrate as recited in claim 1, wherein the active agent is at least one of a gas, liquid, or vapor.

8. An apparatus for processing a substrate as recited in claim 1, wherein the plurality of conduits surrounds the opening to the cavity.

9. An apparatus for processing a substrate as recited in claim 1, wherein the cavity includes at least one inlet configured to input the active gas into the cavity.

10. A proximity head for processing a substrate, comprising:
    at least one first conduit defined within the proximity head, the at least one first conduit configured to apply a fluid to a surface of the substrate; and
    at least one second conduit defined within the proximity head, the at least one second conduit being in close proximity to the at least one first conduit, the at least one second conduit being configured to siphon the fluid from the surface of the wafer;
    wherein application of the fluid to the surface of the substrate and siphoning of the fluid from the surface of the substrate generates a fluid meniscus.

11. A proximity head for processing a substrate as recited in claim 10, further comprising,
    at least one third conduit defined within the proximity head, the at least one third conduit configured to apply an additional fluid to the substrate.

12. A proximity head for processing a substrate as recited in claim 11, wherein the additional fluid is a surface tension reducing fluid.

13. A proximity head for processing a substrate as recited in claim 10, wherein the fluid is a single phase fluid.

14. A proximity head for processing a substrate as recited in claim 10, wherein the second conduit is attached to a siphon tube.

15. A proximity head for processing a substrate as recited in claim 10, wherein the siphon tube includes a restrictor for adjusting fluid flow through the siphon tube.

* * * * *